(12) United States Patent
Li

(10) Patent No.: US 11,601,135 B2
(45) Date of Patent: Mar. 7, 2023

(54) INTERNET OF THINGS DATA COMPRESSION SYSTEM AND METHOD

(71) Applicant: BTS Software Solutions, LLC, Columbia, MD (US)

(72) Inventor: Dunling Li, Bethesda, MD (US)

(*) Notice: Subject to any disclaimer, the term of this patent is extended or adjusted under 35 U.S.C. 154(b) by 0 days.

(21) Appl. No.: 16/803,484

(22) Filed: Feb. 27, 2020

(65) Prior Publication Data

US 2021/0273649 A1    Sep. 2, 2021

(51) Int. Cl.
*H03M 7/00* (2006.01)
*H03M 7/40* (2006.01)
*H03M 7/46* (2006.01)
H03M 7/30 (2006.01)
G16Y 20/10 (2020.01)

(52) U.S. Cl.
CPC .............. *H03M 7/40* (2013.01); *H03M 7/46* (2013.01); *G16Y 20/10* (2020.01); *H03M 7/3088* (2013.01)

(58) Field of Classification Search
CPC .. H03M 7/30; H03M 7/3062; H03M 13/1102; H03M 13/116; H03M 13/611; H03M 13/616; H03M 13/09; H03M 7/40; H03M 7/46; H03M 7/3088; G06F 11/1008; G06F 17/16; G06F 11/10; G06F 11/1076; G06F 17/10; G06F 21/606; G06F 21/85; G06K 9/00496; G06K 9/0057; G06K 9/6232; G06K 9/00523; G06K 9/2054; G06K 9/3233; G06K 9/6249; G06K 9/00536; G06K 9/209; G06K 9/527; G06K 9/6219; G06K 9/6247; G06K 9/6252; G06K 9/6255; G06K 9/6289; G06K 2009/4695

USPC .............. 341/51, 60, 87, 106, 107
See application file for complete search history.

(56) References Cited

U.S. PATENT DOCUMENTS

| | | | |
|---|---|---|---|
| 8,229,709 B2* | 7/2012 | Boufounos | H03M 7/3062 702/196 |
| 8,913,686 B2* | 12/2014 | Barron | H03M 13/1102 375/295 |
| 2006/0088222 A1* | 4/2006 | Han | H04N 19/176 382/232 |
| 2008/0013847 A1* | 1/2008 | Li | H04N 19/86 382/248 |
| 2008/0170591 A1* | 7/2008 | Kameyama | H04L 1/0072 370/476 |
| 2009/0199065 A1* | 8/2009 | Djordjevic | H03M 13/1174 714/752 |
| 2011/0170594 A1* | 7/2011 | Budagavi | H04N 19/182 375/240.13 |
| 2012/0039388 A1* | 2/2012 | Kim | H04N 19/11 375/240.03 |

(Continued)

*Primary Examiner* — Linh V Nguyen
(74) *Attorney, Agent, or Firm* — Sheets Law PLLC; Kendal M. Sheets

(57) ABSTRACT

A disclosure for lossless data compression can include receiving a data block by a processor, performing, by the processor, a sparse transform extraction on the data block, selecting, by the processor, a transform matrix for the data block, modeling, by the processor, the selected transform matrix for the data block, selecting, by the processor, a transform coefficient model for the data block, modeling, by the processor, the selected transform coefficient model for the data block, compressing, by the processor, the data in the data block using the selected transform matrix and the selected transform coefficient model.

28 Claims, 20 Drawing Sheets

(56) References Cited

U.S. PATENT DOCUMENTS

| | | | | |
|---|---|---|---|---|
| 2012/0251013 A1* | 10/2012 | Porikli | ............. | H03M 7/30 |
| | | | | 382/233 |
| 2013/0151924 A1* | 6/2013 | Beadle | ............. | H04L 69/04 |
| | | | | 714/763 |
| 2017/0243589 A1* | 8/2017 | Krueger | ............. | G10L 19/008 |
| 2017/0294024 A1* | 10/2017 | Saquib | ............. | G06T 7/30 |
| 2018/0041776 A1* | 2/2018 | Kim | ............. | H04N 19/122 |
| 2020/0014955 A1* | 1/2020 | Grangetto | ............. | H04N 19/136 |

\* cited by examiner

INTERNET OF THINGS DATA COMPRESSION SYSTEM AND METHOD

TECHNICAL FIELD

The present disclosure relates generally to systems and methods for data compression. In an embodiment, the present disclosure relates to systems and methods for data compression for edge computing, such as data generated for Internet-of-Things devices or systems.

BACKGROUND

When compressing data, the higher the compression ratio, the higher the potential rate of data transfer. However, data compression usually involves a trade-off between high compression ratio and resources (e.g., time, computing power, and power consumption). In real-time applications, in which the time between generation of data and the processing and receipt of the data should be as small as possible, computation complexity and delay costs often cannot be tolerated. Further limitations are imposed when lossless compression is desired. Lossless compression usually achieves a lower compression ratio as compared to lossy compression. Known compression algorithms, such as the Lempel-Ziv algorithm or Huffman coding, can be used to compress telemetry data, but these compression algorithms cannot be used in realtime compression because entire data set needs be explored to build dictionary during the compression. Furthermore, their computational complexity and delay costs may not be tolerable in real-time applications.

The commercial and industrial fields that have adopted the use of data collection devices using the technology of Internet-of-things (IoT) can include, but is not limited to, transportation, refining, manufacturing, power production, water treatment, health care, and smart technologies such as smart and networked vehicles, smart cities, smart buildings, and smart cities. It is often not practical to collect data in real-time and transmit the data using lossless data protocols due to one or more of connectivity problems between a remote device and cloud storage/the Internet, lack of bandwidth needed to transmit data in real-time for many remote distributed wireless networks, such as cellular networks, and cost of purchasing excessive bandwidth and cloud storage needs to handle the real-time data from multiple IoT devices.

The disclosed systems and methods are directed to overcoming one or more of the shortcomings set forth above and/or other shortcomings of the prior art.

SUMMARY

There is a need for real-time lossless data compression framework for wirelessly-connected data collection devices, such as Internet-of-Things ("IoT") edge devices or IoT gateways. Lossless data compression technique that can compress data in real-time can provide bandwidth and storage savings by identifying and eliminating redundancy while still retaining the necessary information, can meet those needs. An IoT gateway can enable management of network data traffic flowing between protocols and networks. Additionally, gateways can translate network protocols and also ensure that devices and sensors are connected properly to a network. Gateways can also include encryption protocols for secure data transmission.

In one aspect of the disclosure, a method for lossless data compression can include receiving a data block by a processor, performing, by the processor, a sparse transform extraction on the data block, selecting, by the processor, a transform matrix for the data block, modeling, by the processor, the selected transform matrix for the data block, selecting, by the processor, a transform coefficient model for the data block, modeling, by the processor, the selected transform coefficient model for the data block, compressing, by the processor, the data in the data block using the selected transform matrix and the selected transform coefficient model. In another aspect of the disclosure, a lossless data compression system can include a gateway comprising a processor that can receive a stream of data, where the processor is configured to compress data using a multichannel data compression encoder by receiving a data block, performing a sparse transform extraction on the data block, selecting a transform matrix for the data block, modeling the selected transform matrix for the data block, selecting a transform coefficient model for the data block, modeling the selected transform coefficient model for the data block, and compressing the data in the data block using the selected transform matrix and the selected transform coefficient model.

Advantages of the exemplary embodiments of the disclosure can significantly reduce the bandwidth needed for communications between IoT gateways and a data server. The embodiments' encoded bitstream, which is continuous with up to one-third of original traffic rates, is suitable for significant bandwidth savings for IoT technologies and edge computing. The embodiments can also significantly reduce computation complexity, power consumption, memory requirement, and algorithm delay, and allow parallel processing as well.

BRIEF DESCRIPTION OF THE DRAWINGS

The disclosed subject matter of the present application will now be described in more detail with reference to exemplary embodiments of the apparatus and method, given by way of example, and with reference to the accompanying drawings, in which.

DETAILED DESCRIPTION OF EXEMPLARY EMBODIMENTS

A few inventive aspects of the disclosed embodiments are explained in detail below with reference to the various figures. Exemplary embodiments are described to illustrate the disclosed subject matter, not to limit its scope, which is defined by the claims. Those of ordinary skill in the art will recognize a number of equivalent variations of the various features provided in the description that follows.

As utilized herein the terms "circuits" and "circuitry" refer to physical electronic components (i.e., hardware) and any software and/or firmware ("code") that may configure the hardware, be executed by the hardware, and or otherwise be associated with the hardware. As used herein, for example, a particular processor and memory (e.g., a volatile or non-volatile memory device, a general computer-readable medium, etc.) may comprise a first "circuit" when executing a first one or more lines of code and may comprise a second "circuit" when executing a second one or more lines of code. Additionally, a circuit may comprise analog and/or digital circuitry. Such circuitry may, for example, operate on analog and/or digital signals. It should be understood that a circuit may be in a single device or chip, on a single motherboard, in a single chassis, in a plurality of enclosures at a single geographical location, in a plurality of enclosures distributed over a plurality of geographical locations, etc.

As utilized herein, circuitry is "operable" to perform a function whenever the circuitry comprises the necessary hardware and code (if any is necessary) to perform the function, regardless of whether performance of the function is disabled, or not enabled (e.g., by a user-configurable setting, factory setting or trim, etc.).

Figure 1:
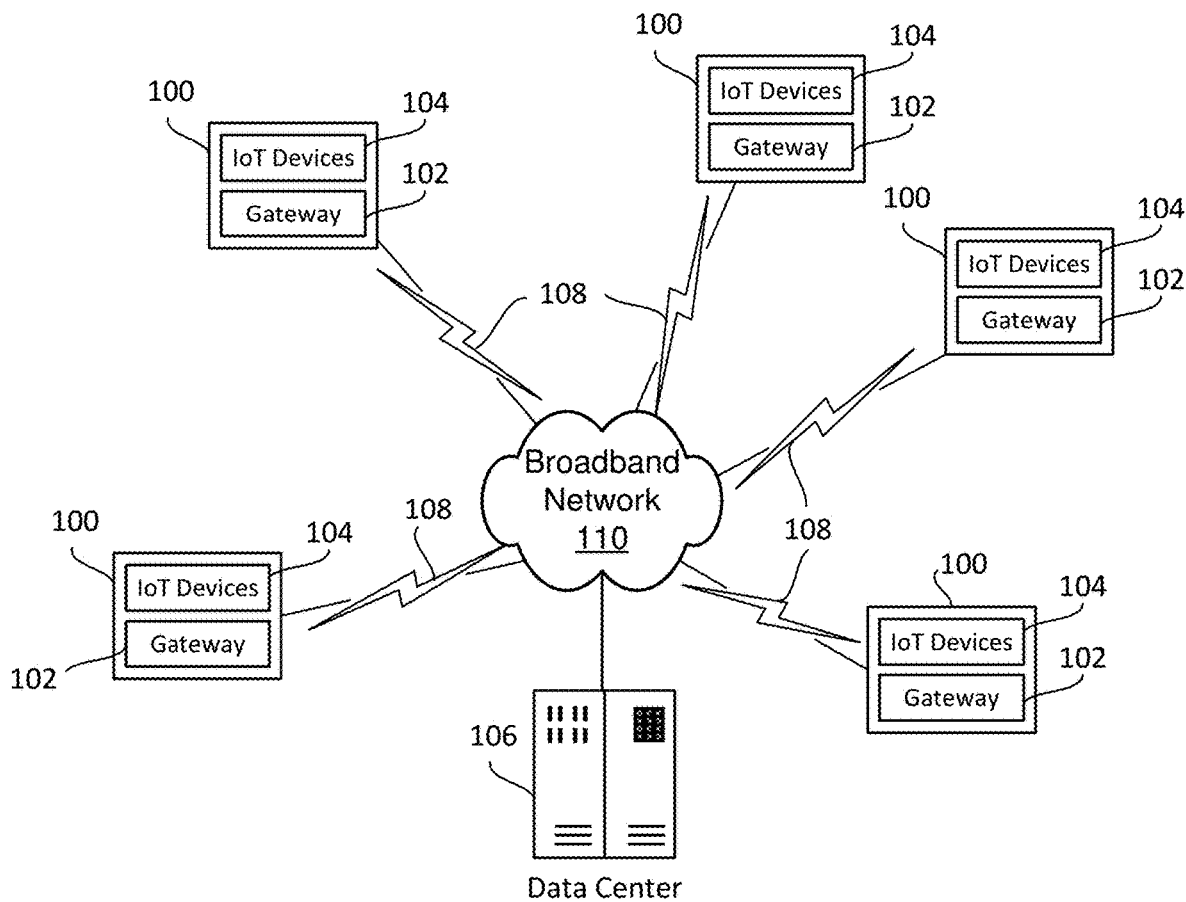
FIG. 1 is network diagram of an exemplary IoT ecosystem.

FIG. 1 is network diagram of an embodiment for an IoT ecosystem. The IoT ecosystem includes remote units 100 that can be installed in a mobile or stationary arrangement. Each remote unit 100 can include one or more IoT device gateways 102 or embedded systems. Each gateway 102 can include one or more processors, computers, memories, computer drives, and/or network communication devices along with software and controls for operating the gateway 102 and executing commands. Gateways 102 can receive data or images from one or more IoT devices 104 such as, but not limited to, various sensors, gauges, controls, cameras, computers, circuits, transceivers, processors, etc. Each gateway 104 can communicate over wired or preferably wireless network communication lines 108 to a broadband network 110, such as the Internet, to a connected data storage such as data center 106. Communication lines 108 can include communications channels in a cellular network, Wi-Fi network, Bluetooth channels, local area network ("LAN") lines, etc. Data center 106 could be a cloud-based data center accessed via broadband network 110 or Internet, LAN, a centralized data server and communications portal that can communicate with broadband network 110 or Internet. In an embodiment, the network connections 108 between IoT gateways 102 and the data center 106 can use network communication protocols such as packet-switched network protocols, satellite communication protocols, Wi-Fi, cellular, Zigbee, Z-wave, etc.

Figure 2:
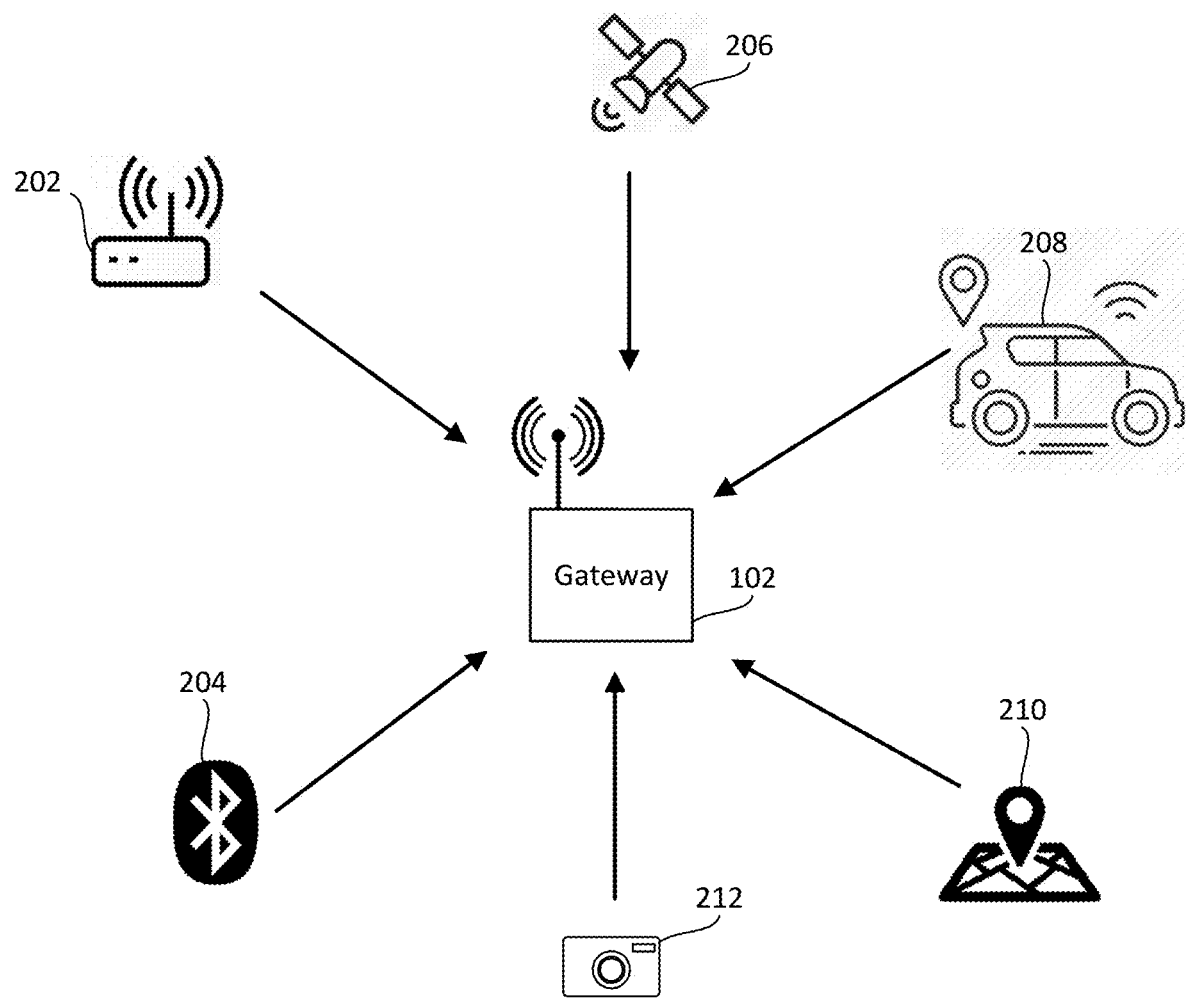
FIG. 2 is a network diagram of an exemplary data collection devices for the IoT ecosystem of FIG. 1.

FIG. 2 is a network diagram of exemplary data collection and/or communication devices 104 for the IoT ecosystem of FIG. 1. Examples of IoT data collection and/or communication devices 104 can include, but are not limited to, a WiFi router and modem 202 communicating over WiFi using TCP/IP protocols, a Bluetooth device 204 communicating using Bluetooth or MQTT protocols, a smart car 208 such as on a vehicle communicating using Zigbee mesh network protocols, a remote device 212 such as a camera in a static or moving configuration communicating using Z-Wave mesh network protocols, and an end device or another gateway 210 at a static location or in movement communicating using Low-Power, Wide Area networking ("LoRaWan") or WebSocket protocols. Communication connections between the gateway 102 and the data center 106 can occur over cellular networks using a cellular modem 200. Alternative communication protocols and channels between the gateway 102 and data center 106 can include satellite, LAN, WLAN, microwave, or any other appropriate protocol. Embodiments of an IoT data compression system and method, and analytical feature detection, can be executed at areas of data integration and the gateway 102 or embedded system. The methods and systems of the embodiments can be implemented for both real-time data and for saved file data operations.

System Architecture

Figure 3:
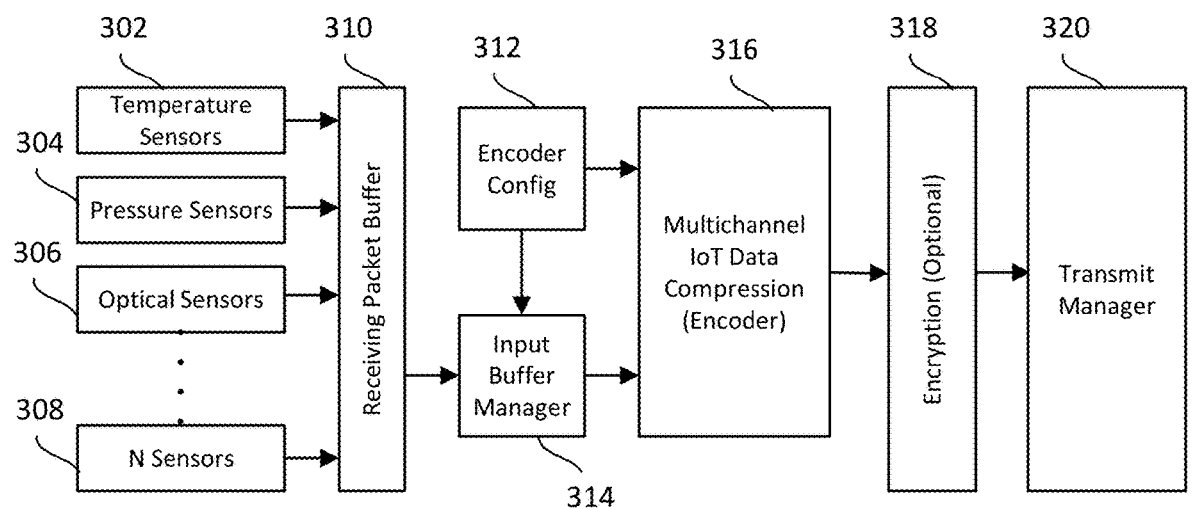
FIG. 3 is a block diagram of an exemplary IoT data compression system architecture of the embodiments.

FIG. 3 is a block diagram of an exemplary IoT data compression system architecture. In an embodiment, the data compression system architecture in FIG. 3 can be located within the exemplary gateway 102 on one or more processors, circuits, computers, embedded systems, or other appropriate computing devices. In other embodiments, the data compression system architecture in FIG. 3 can be located in other gateway devices, can be cloud-based on the Internet, or could be located at any appropriate location along communication channels to the data center 106. In the embodiment, an Input Buffer Manager 314 can receive data streams or packets from different sensor devices or gauges in the IoT devices 104. The types of sensors or gauges can include, but are not limited to temperature sensors 302, pressure sensors 304, optical sensors 306, and any other type of IoT data gathering sensor 308 such as vehicle or manufacturing data sensors, etc., such as those described herein. Multiple data streams from sensors 302-308 can be received at receiving packet buffer 310, which can control stream buffers to the input data manager 314. The input data manager 314 can manage the multiple data streams and buffer the data streams into a multichannel IoT data compression module ("Encoder") 316 according to protocols set by an encoder configuration module 312. The encoder 316 can produce a block-based single compressed bitstream, which could be encrypted by encryption module 318 if desired or necessary. The compressed bitstream can then be received by a transmit manager 320 that can format the real-time bitstream into transmission packets according to predefined protocols and transmit the packets to the data center 106 through cellular modems 200 or other appropriate transmission devices and mediums.

Figure 4:
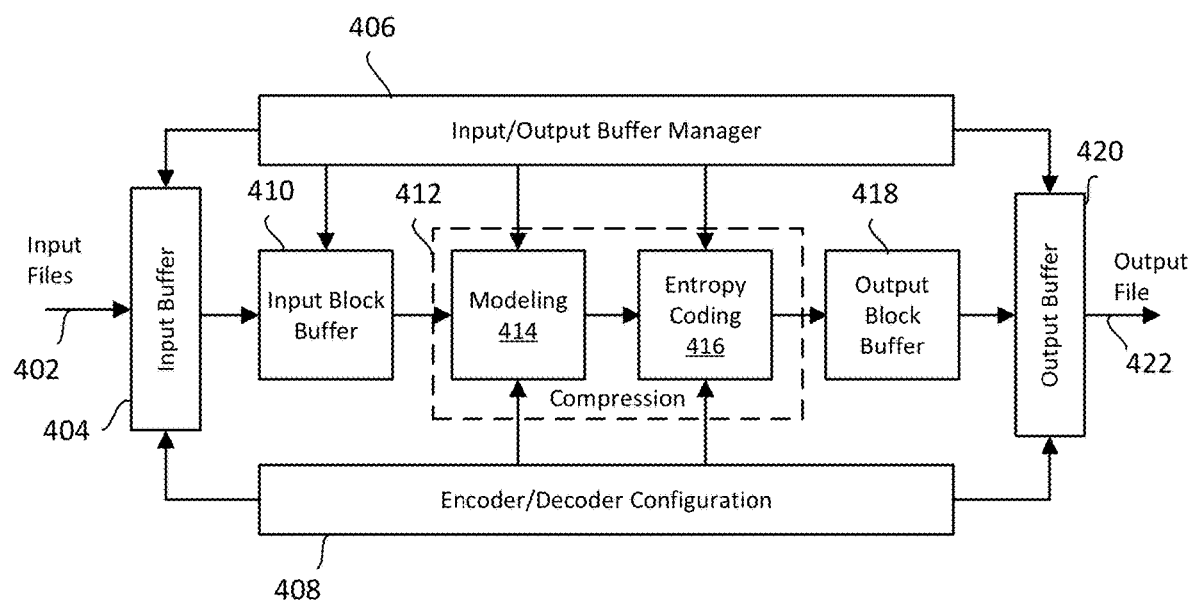
FIG. 4 is a block diagram of an exemplary software architecture of a compression algorithm implementation of the embodiments.
Figure 5:
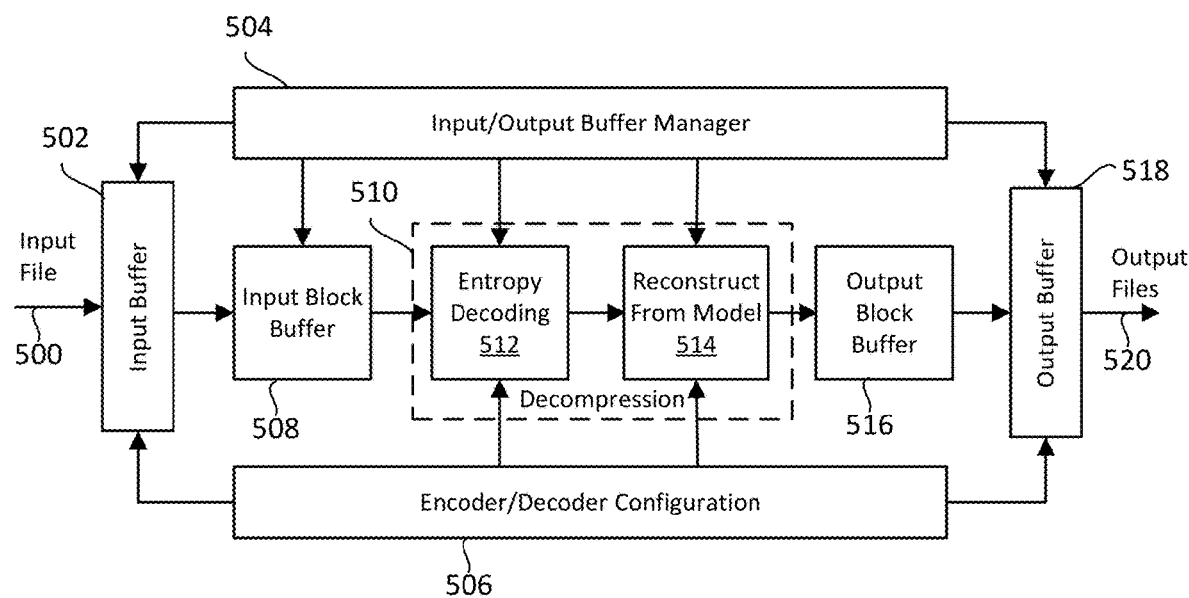
FIG. 5 is a block diagram of an exemplary software architecture of a decompression algorithm implementation of the embodiments.

FIG. 4 is a block diagram of an exemplary software architecture of a compression algorithm implementation of the embodiments, and FIG. 5 is a block diagram of an exemplary software architecture of a decompression algorithm implementation of the embodiments. Although FIG. 4. describes software architecture of a compression algorithm implementation, and FIG. 5 describes software architecture of a decompression algorithm implementation, in an embodiment, to simplify implementation the functions of compression and decompression can be implemented in the same software architecture. In an embodiment, there can be four general modules in the implementation: configuration, buffer manager, modeling/reconstruct, and entropy coding/decoding. In FIG. 4, in one embodiment, a software architecture can include modules of an input buffer 404, an input block buffer 410, a compression algorithm 412 comprising modeling 414 and entropy coding 416, an output block buffer 418, and output buffer 420, an input/output buffer manager 406, and an encoder/decoder configuration manager 408. The encoder/decoder configuration module 408 can take initialization variables from system requirements, such as delay, sampling rates, transmission duration, etc. and configure the input/output buffer manager 406 and compression or decompression. The input/output buffer manger 406 can receive input files 402 and can handle preprocessing and multiple data source synchronization. The input/output buffer manager 406 can demultiplex any multiplexed data from the input buffer 404 and can place a block of data into input block buffer 410 for encoding or for multiplexing the encoded bitstream from the output block buffer 418 to the output buffer 420 as an output file 422 for decoding.

In FIG. 5 an exemplary software architecture of decompression algorithm implementation that is not combined with the implementation in FIG. 4 can include modules of an input buffer 502, input/output buffer manager 504, encoder/decoder configuration 506, input block buffer 508, a decompression algorithm 510, entropy decoding 512, reconstruct from model 514, output block buffer 518. Input file 500 can be the same output file 422 of FIG. 4. The software architecture of FIG. 5 can function similar to its counterpart in FIG. 4 but in reverse. Decompression processes 510 can include entropy decoding 512 and reconstruct from model 514. The input/output buffer manager 504 can manage the process of input buffer 502 receiving input file 500 and can control data blocks from input block buffer 508 entering decompression algorithm 510, and manage output of the decoded file 520 by output buffer 518. The encoder/decoder configuration 506 can configure entropy decoding module 512 that can receive data blocks from input block buffer 508 and decode data that was previously encoded by entropy coding module 416. Next, the encoder/decoder configuration 506 can send the decoded data to reconstruct the original data using reconstruct from model module 514. Reconstructed data is then transmitted to output block buffer 516 for buffering data blocks that are then output as a data files 520 by output buffer 518.

Realtime IoT Data Compression Processes

Figure 6:
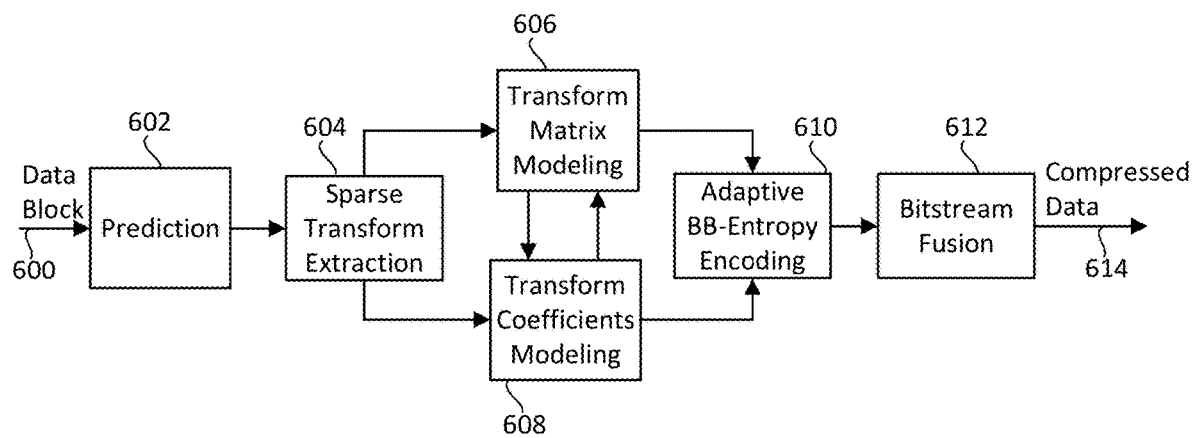
FIG. 6 illustrates a flowchart of an exemplary sparse transform based lossless data compression method as performed on the multichannel IoT data compression encoder of FIG. 3.

FIG. 6 illustrates a flowchart of an exemplary sparse transform based lossless data compression algorithm as performed on the multichannel IoT data compression encoder of FIG. 3. In an embodiment, the method can include, but is not limited to, a prediction process 602, a sparse transform extraction process 604, transform matrix modeling 606, transform coefficients modeling 608, adaptive BB-entropy encoding 610, and bitstream fusion 612. In some embodiments, bitstream fusion is used to combine the bit-stream from entropy encoding of prediction residuals and model parameters into single bit-stream as final output of the encoding process. It includes defining the dynamic ranges of model parameters, representing them using minimum number of bits, utilizing common data between prediction model and residuals, and packing them in proper order so that decoding can be started as soon as receiving the beginning of bit-stream without waiting for the entire bit-stream of the current block. In an embodiment, a data block 600 can be received from input block buffer 410. In some embodiments, as the realtime IoT data compression algorithm processes data in blocks, the size of blocks can be far less than a number of possible sample values, i.e., 6553 for 16 bit integers. The embodiments include a sparse transform algorithm to map a large number of values to a subset with a very small number of elements while maintaining the sparse elements with a 1:1 mapping. In an embodiment the algorithm can be partially defined as $Y=AX$, where A is n×M sparse transfer matrix, n is a number of elements in a subset, and M is the number of elements in the original set. In a non-limiting example, if sensor data is a 16 bit integer, then M=65526 and n=a number of possible values in a given block n≤B, where B is the block size. For a given input block of data X, the compression algorithm can find a sparse transform matrix A at step 604, define its transform model at step 606, produce corresponding transform coefficients and model its transform coefficients at step 608, then apply block-based entropy at step 610 for bitstream fusion at step 612 to generate a compressed bitstream 614. For output, in one embodiment the method can use variable length compressed bitstream which can be stored or transmitted as characters but is not limited to any particular compression bitstream protocol.

Figure 7:
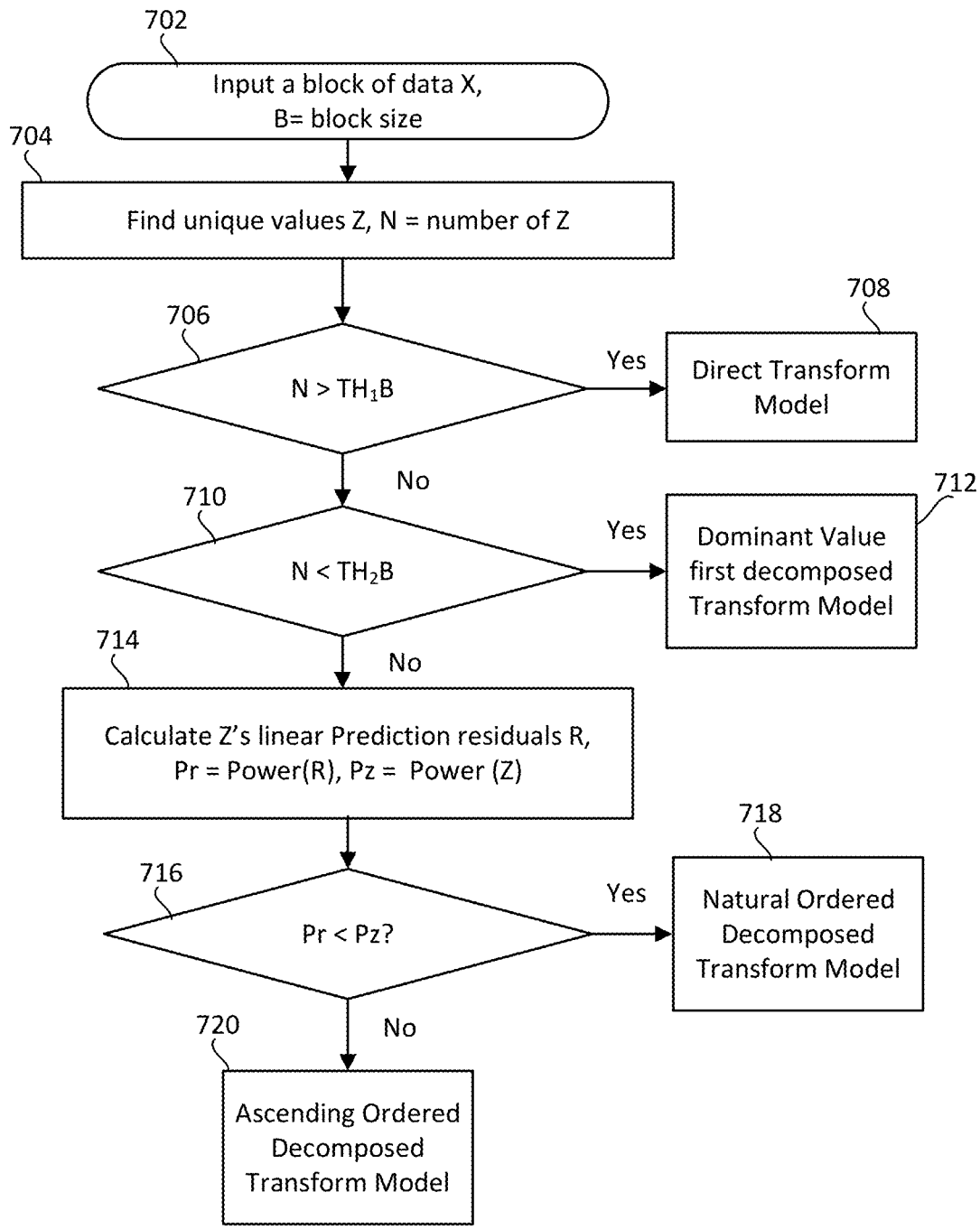
FIG. 7 illustrates a flowchart of an exemplary transform model selection method as performed on the multichannel IoT data compression encoder of FIG. 3.

FIG. 7 illustrates a flowchart of an exemplary transform model selection method as performed on the multichannel IoT data compression encoder 316. FIG. 7 depicts an embodiment of a method of the sparse transform extraction 604 in FIG. 6. For pre-processing, as IoT sensors generate monitoring data continuously, the data are highly correlated to their neighbors. The differential operation of the embodiments can be used as pre-process to remove the redundancy between nearest neighbors. For a given input block of data and its data type, the goal of sparse transform extraction is to find non-zeros components of sparse transform matrix C from $Y=CX$, where X is the vector of all the possible value of input data type and Y is the vector of and input data block. Depending on the characteristics of Y, theoretically we could remove redundancy in transform matrix further by decomposing C into $C=AB$, such that $Y=AZ$ and $Z=BX$, where Z is the vector of unique values in the block Y. The sparse transform can also be represented as $Y=ABX$. Transform matrixes A, B and C are binary and sparse. The total number of bits after compression equals the number of bits for transform matrix representation plus number of bits for transform coefficients. The less the numbers of bits after compression are, the higher the compression ratios are. In general, when the number of unique values are close to the block size, direct transform model Y=CX yields a better compression ratio than the decomposed model Y=ABX and vice-versa. There are many ways to decomposing C into A and B. Different decomposition models will yield different compression ratios depending on the input data.

The exemplary transform model selection process in FIG. 7 can begin at step 702, to input a block of data X, where B=block size. The input data block can be a sequence of numerical data with size n. The data types may vary among 8 or 16 or 32 or 64 bits signed/unsigned integers and 32 or 64 bits floating point numbers. The method can continue to step 704, to find unique values Z, where N=number of Z. At the next decision step 706, if N is greater than a first threshold of B, then the encoder 316 can select a direct transform model at step 708. If N is less than a first threshold of B, the encoder 316 can continue to decision step 710. In a non-limiting embodiment, the first threshold of B can be 0.75B. At decision step 710, the encoder 316 can determine if N is less than a second threshold of B. In a non-limiting embodiment, the second threshold of B can be 0.25B. If yes, then the encoder 316 can select a dominant value first decomposed transform model at step 712. If no, then at step 714 the encoder 316 can calculate Z's linear prediction residuals R, where Pr=Power(R), and Pz=Power (Z). The method can then continue to decision step 716 where the encoder 316 can determine if Pr is less than Pz. If yes, then at step 718 the encoder 316 can select a natural ordered decomposed transform model. If no, then at step 720 the encoder 316 can select an ascending ordered decomposed transform model.

Figure 8:
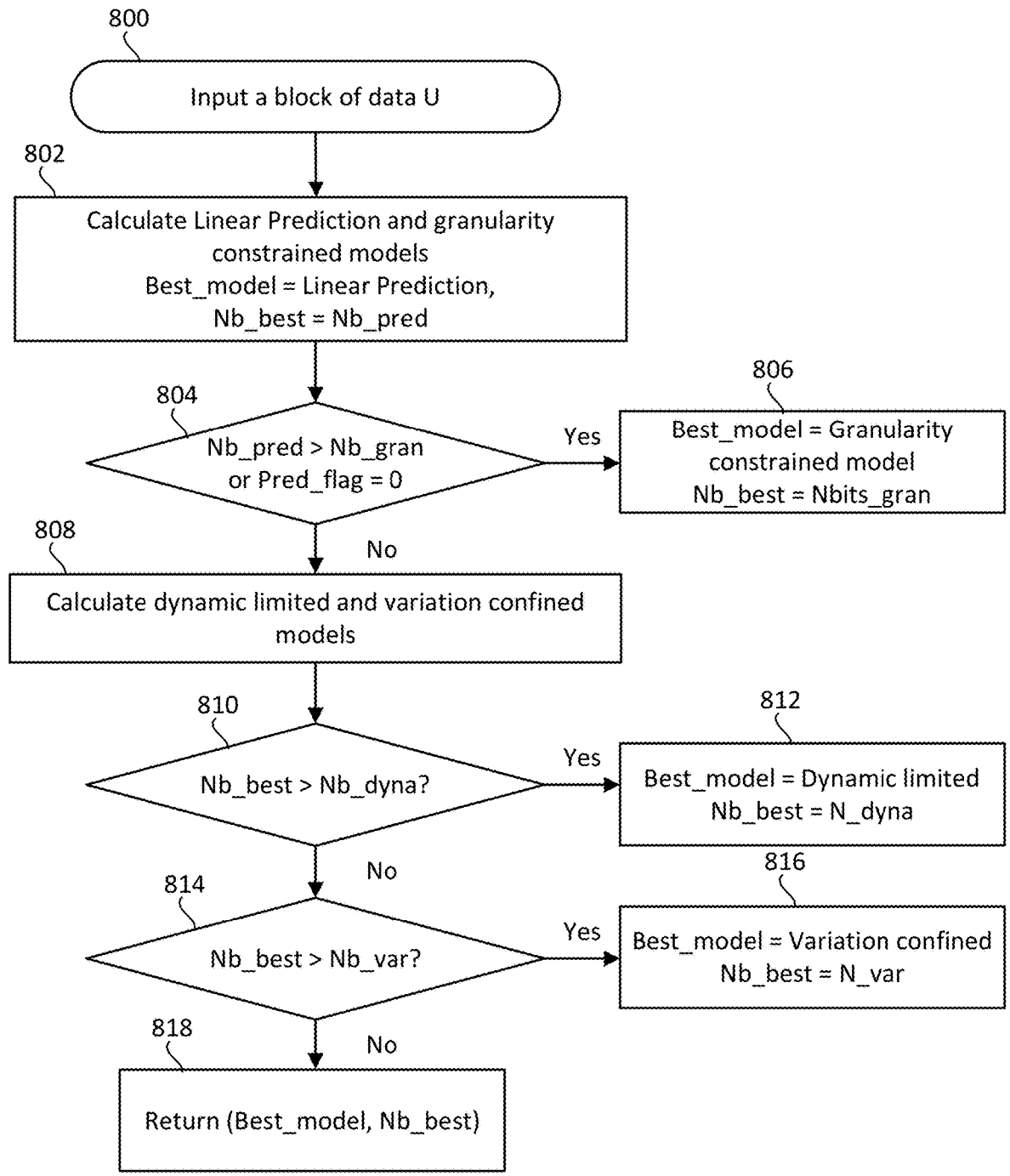
FIG. 8 illustrates a flowchart of an exemplary transform coefficient model selection method as performed on the multichannel IoT data compression encoder of FIG. 3.

In an embodiment of transform matrix modeling step 606, as the transform matrixes are binary sparse, the key of their efficient representation is to reduce the redundancy among non-zero locations, inherited from the correlation of input data. Sparse transform modeling is to find the sparse transform model which provides the highest compression ratio by analyzing input data using the following decomposition methods: (1) Directly transformation: Y=CX; (2) Dominate value first decomposed transformation: Y=AZ and Z=BX, where Z is ordered by the most frequently occurrence first; (3) Ascending ordered decomposed transformation: Y=AZ and Z=BX, where Z is ordered by the smallest value first; (4) Natural ordered decomposed transformation: Y=AZ and Z=BX, where Z is ordered by the order of input data. Although different transform models produce different transform coefficients, the best transform model will be determined by minimizing the total number of bits required to present both transforms and transform coefficients. The transform model selection algorithm is shown in FIG. 8. For an example, if the data type of Y is a 16 bits integer and block size is 32 and the number of unique values is 7, then there are 32 ones and 192 zeros in matrix A, 7 ones and 45,875 zeros in matrix B and 32 ones and 2,097,120 zeros in C. The sparse transform could be represented as either $$\begin{bmatrix} y1 \\ \vdots \\ y32 \end{bmatrix} = \begin{bmatrix} c_{1,1} & \cdots & c_{1,65536} \\ \vdots & \cdots & \vdots \\ c_{32,1} & \cdots & c_{32,65536} \end{bmatrix} \begin{bmatrix} -32768 \\ \vdots \\ 32767 \end{bmatrix} \quad (1)$$

or $$\begin{bmatrix} y1 \\ \vdots \\ y32 \end{bmatrix} = \begin{bmatrix} a_{1,1} & \cdots & a_{1,7} \\ \vdots & \cdots & \vdots \\ a_{32,1} & \cdots & a_{32,7} \end{bmatrix} \begin{bmatrix} b_{1,1} & \cdots & b_{1,65536} \\ \vdots & \cdots & \vdots \\ b_{7,1} & \cdots & b_{7,65536} \end{bmatrix} \begin{bmatrix} -32768 \\ \vdots \\ 32767 \end{bmatrix} \quad (2)$$

In this case, the total number of bits of a block of 16 bits integer data is 32×16=512 bits. If we choose uniformed model for transform coefficients, then the total number of bits after compression for direct transform model (1) equal to 32n, where n is the number of bits for each transform coefficient and n≤16. In decomposed transform model (2), the total number of bits after compression is 7n+101, i.e. representing matrix A and B needs log 2(32)+32×ceiling(log 2(7))=101 bits and 7n respectively. Therefore, the difference between (1) and (2) are 32n−7n−101=25n−101. If n≤4, model (1) will be chosen, i.e. direct transformation method. Otherwise decomposed model (2) will the better, the chosen model will be among dominate first, ascending or nature ordered decomposed methods depending which one get the minimum number of bits to represent input data.

FIG. 8 illustrates a flowchart of an exemplary transform coefficient model selection method as performed on the multichannel IoT data compression encoder 316 of FIG. 3. The transform coefficients can contain the same data type as the input data, but the number of data is much smaller than number of all possible values for the given data type. In the previous example, the number of transform coefficients is seven while the number of possible 16 bits integer values is 65536. The transform coefficients can also keep the correlation from original data. The following models could be used in the representation of the transform coefficients: prediction model, granularity constrain model, variation constrain model and dynamic limitation model.

In the transform coefficients model selection process illustrated in FIG. 8, the encoder 316 can select the most efficient model by minimizing the number of bits to represent the given input data. The process can begin at step 800 where the encoder 316 can receive an input of a block of data U. In the next step 802, the process can calculate linear prediction and granularity constrained models, where Best_model=Linear Prediction, and Nb_best=Nb_pred. The process can continue to decision step 804, where the encoder 316 can determine if Nb_pred≥Nb_gran or Pred_flag=0. If yes, then at step 806 Best_model=granularity constrained model and Nb_best=Nbits_gran. If no, then at step 808 the encoder 316 can calculate dynamic limited and variation confined models. To calculate the models, at step 810 the encoder 316 can determine if Nb_best≥Nb_dyna. If yes, then at step 812 Best_model=Dynamic limited and Nb_best=N_dyna. If no, then at decision step 814 the encoder 316 can determine if Nb_best≥Nb_var. If yes, then at step 816 the Best_model=Variation confined and Nb_best=N_var. If no, then at step 818 the process returns the best model and Nb_best.

Figure 9:
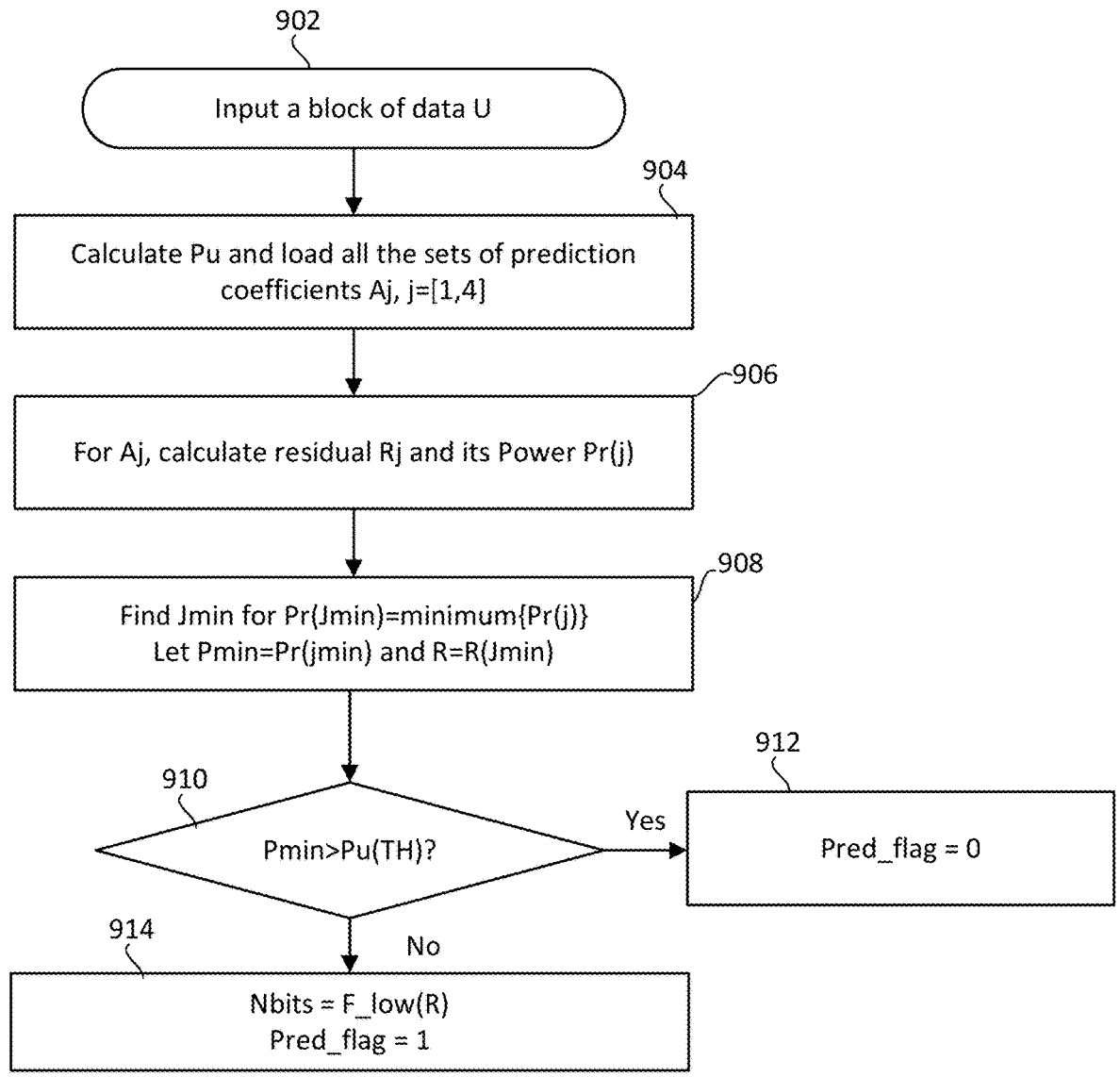
FIG. 9 illustrates a flowchart of an exemplary transform coefficients linear prediction modeling method as performed on the multichannel IoT data compression encoder of FIG. 3.

FIG. 9 illustrates a flowchart of an exemplary transform coefficients linear prediction modeling method as performed on the multichannel IoT data compression encoder 316 of FIG. 3. In an embodiment of a linear prediction model, linear prediction can be used to remove spatial redundancy among the input data, i.e. transform coefficients. Let $U=[u_1, u_2, \ldots, u_N]^T$ be the coefficient vector and its predicted vector $V=[v_1, v_2, \ldots, v_N]^T$, then $v_i = \Sigma_{k=1}^{P} \alpha_k u_{i-k}$, where $\alpha_k$s are prediction coefficients, p is the order of prediction model. In one embodiment the process can choose p=3 for block size, which is less than 128, and p=5 otherwise. Other embodiments can choose higher or lower block sizes depending on the type and/or amount of data and/or operational specifications. A prediction residual vector is R=U−V, i.e. $r_i = -\Sigma_{k=0}^{P} \alpha_k u_{i-k}$ and prediction coefficients $\alpha_k$ can be calculated by minimizing the average prediction residual power $$P_r = \frac{1}{N}\sum_{i=1}^{N} r_i^2$$

while power of original coefficients can be calculated by $$P_u = \frac{1}{N}\sum_{i=1}^{N} u_i^2.$$

The coefficients can be found using Levinson-Durbin recursion method. Since the prediction coefficients are floating point values, it is not efficient to transmit them in lossless compression. In some embodiments, the process can use four sets of pre-defined empirical values so that the residuals can be calculated accordingly. Other embodiments can use greater or less than four sets, depending on efficiencies and data for the process. The set yielding the minimum Pr can be used to compare with Pu. In an embodiment, if the minimum Pr is greater than a pre-defined threshold of Pu, the prediction modeling may not be effective, i.e. return prediction flag as zero (pred_flag=0). In one embodiment, a threshold can be defined as twenty-five percent of Pu. In other embodiments, the threshold could be lesser or greater than twenty-five percent of Pu. Otherwise, the encoder 316 can calculate the number of bits to represent prediction residuals using number of bits computation function for variation confined data since the process assumes prediction residuals are close to zeros.

An exemplary process for linear prediction modeling in FIG. 9 can begin at step 902 with the encoder 316 receiving an input block of data U. At step 904, the encoder 316 can calculate Pu and load all the sets of prediction coefficients Aj, where j=[1,4]. At the next step 906, for Aj, the encoder 316 can calculate a residual Rj and its power Pr(j). At the next step 908, the encoder 316 can find Jmin for Pr(Jmin)=minimum{Pr(j)} and let Pmin=Pr(jmin) and R=R (Jmin). In the next step 908, the encoder 316 can find Jmin for Pr(Jmin)=minimum{Pr(j)} and let Pmin=Pr(jmin) and R=R(Jmin). At the next decision step 910, the encoder 316 can determine if Pmin is greater than a Pu threshold. If yes, then at step 912 the Pred_flag=0. If no, then at step 914 Nbits=F_low(R) and Pred_flag=1. The Pu threshold is exemplary and can vary according to user protocols. For example, in a non-limiting embodiment, Pu(TH) can be 0.25 Pu.

Figure 10:
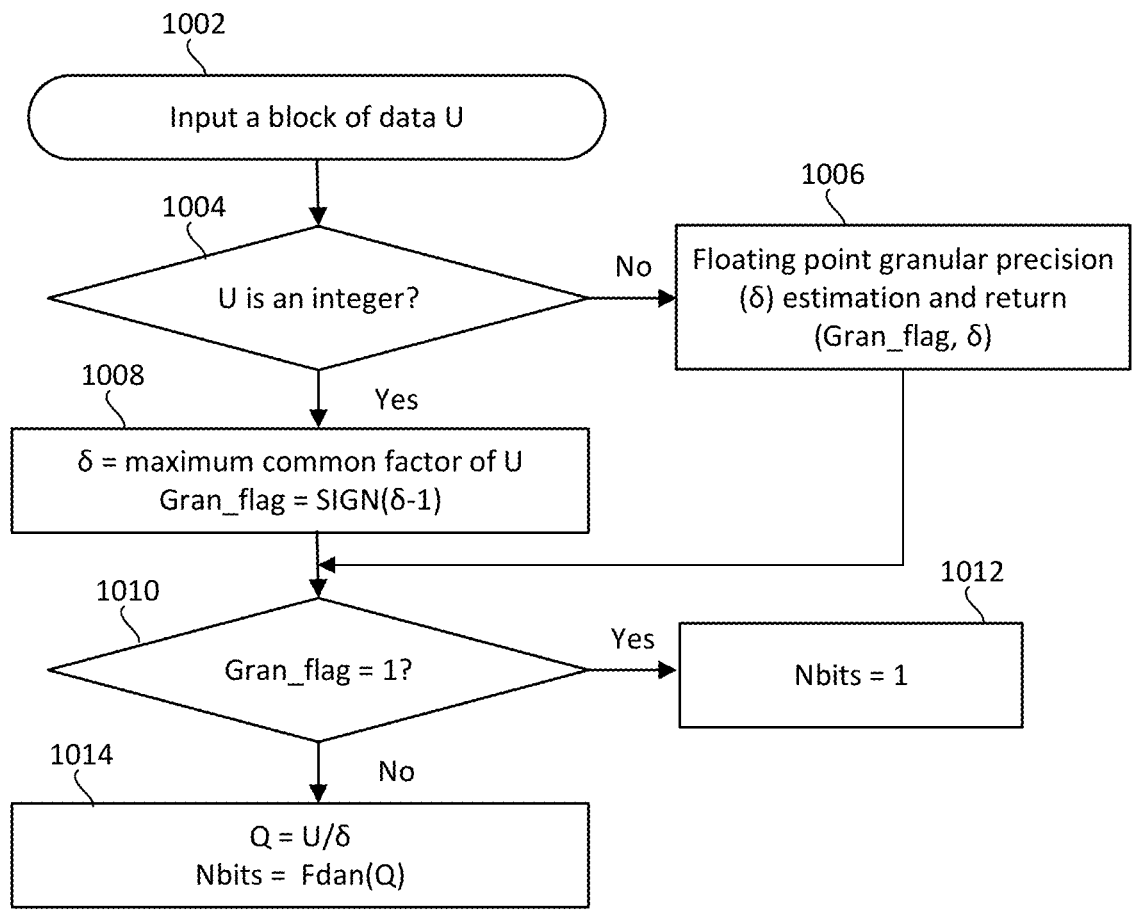
FIG. 10 illustrates a flowchart for an exemplary method of granularity constrained modeling as performed on the multichannel IoT data compression encoder of FIG. 3.

FIG. 10 illustrates a flowchart for an exemplary method of granularity constrained modeling as performed on the multichannel IoT data compression encoder 316. An exemplary granularity constrain model can remove the redundancy from oversampling or too much precision among the input data (transform coefficients). The flowchart of an exemplary method in FIG. 10 illustrates how to find the granular precision, i.e., maximum value δ which all the input data are multiples of δ. If input data are integers, then δ is the greatest common factor. Otherwise floating point granular precision estimation algorithm in FIG. 11 can be used to find δ.

The process in FIG. 10 can begin at step 1002 where the encoder 316 can receive an input of a block of data U. At decision step 1004, the encoder 316 can determine if U is an integer. If no, then at step 1006 the encoder 316 can determine a floating point granular precision estimation (δ) and return to the process (Gran_flag, δ). If yes, then at step 1008 δ=maximum common factor of U and Gran_flag=SIGN(δ-1). Next, at decision step 1010 the encoder 316 can determine if Gran_flag=1. If yes, then at step 1012 Nbits=1 at step 1012. If no, then at step 1014 Q=U/δ and Nbits=Fdan(Q).

Figure 11:
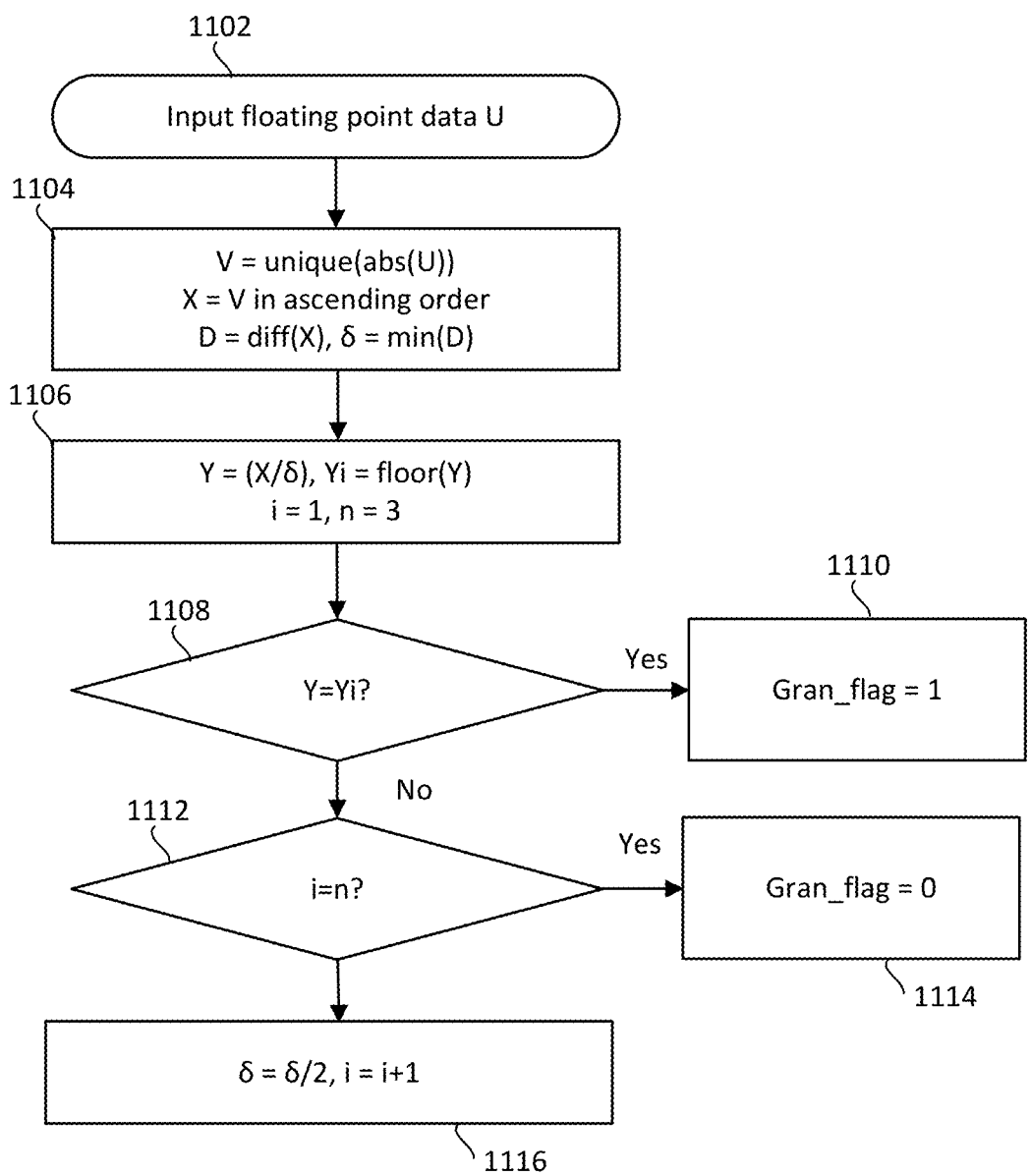
FIG. 11 illustrates a flowchart for an exemplary floating point granular precision method as performed on the multichannel IoT data compression encoder of FIG. 3.

In the process of FIG. 10, if input data are integers, then δ is the greatest common factor, otherwise the process in FIG. 11 will be used to find δ. FIG. 11 illustrates a flowchart for an exemplary floating point granular precision method as performed on the multichannel IoT data compression encoder 316. The process can begin at step 1102, where the encoder 316 can receive input floating point data U. At step 1104, the encoder 316 can define V=unique(abs(U)), X=V in ascending order, and D=diff(X), δ=min(D). At step 1106, the encoder 316 can define Y=(X/δ), Yi=floor(Y) where i=1, and n=3. Next, at decision step 1108 the encoder 316 can determine if Y=Yi. If yes, then at step 1110 Gran_flag=1. If no, then at decision step 1112, the encoder 316 can determine if i=n. If yes, then at step 1114 Gran_flag=0. If no, then at step 1116 δ=δ/2 and i=i+1.

Figure 12:
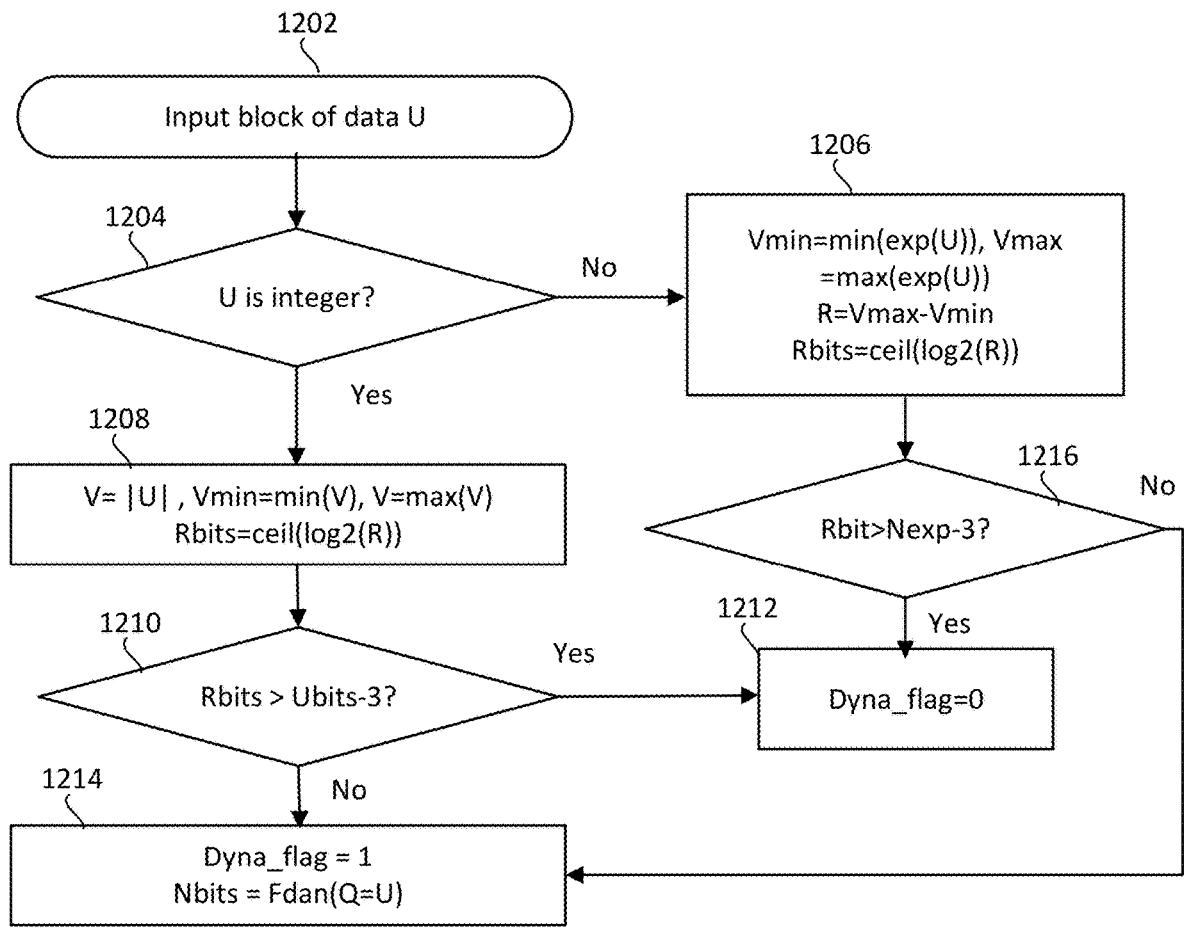
FIG. 12 illustrates a block diagram for an exemplary method of dynamic limited modeling as performed on the multichannel IoT data compression encoder of FIG. 3.
Figure 13:
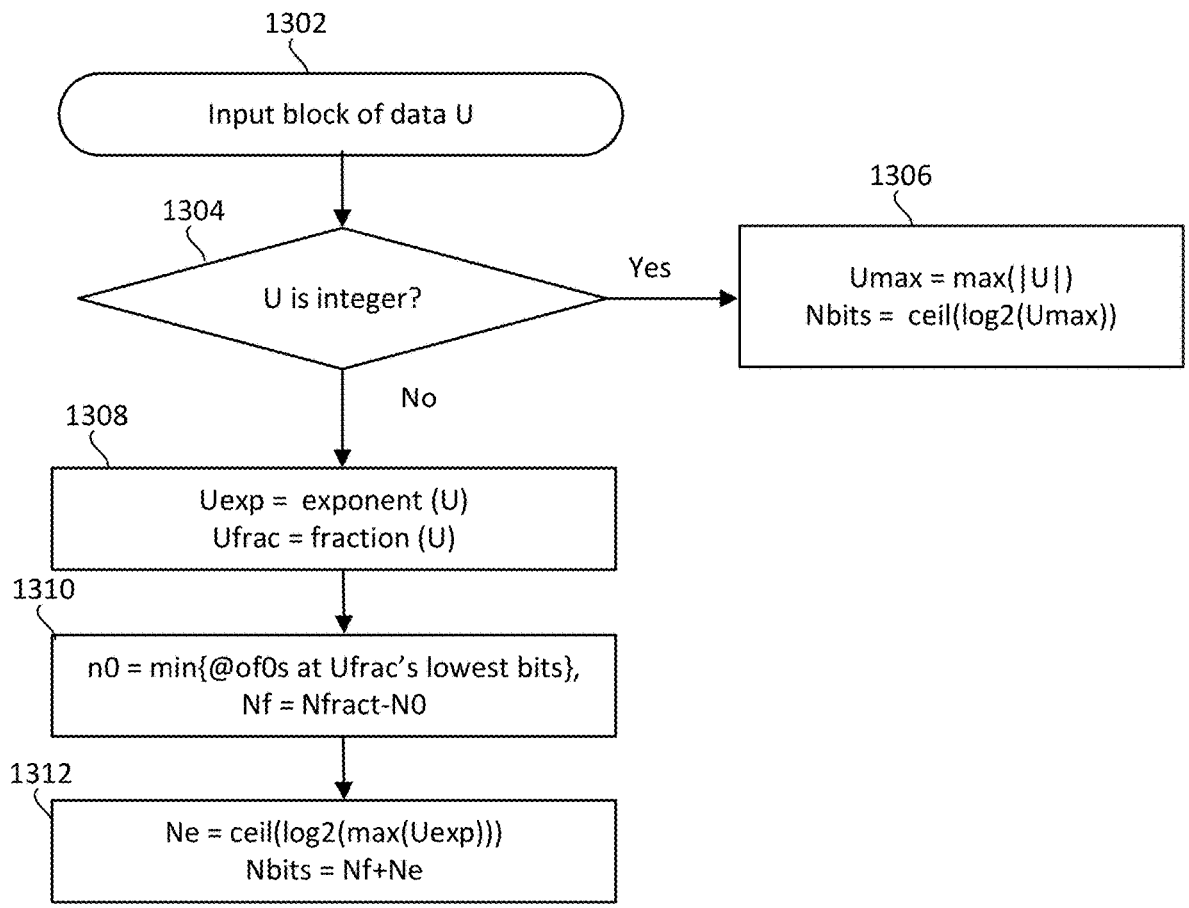
FIG. 13 illustrates a flowchart for an exemplary method of variation confined modeling as performed on the multichannel IoT data compression encoder of FIG. 3.

FIG. 12 illustrates a block diagram for an exemplary method of dynamic limited modeling as performed on the multichannel IoT data compression encoder 316. An exemplary dynamic limited model can reduce a number of bits representation for a given block of data by identifying its dynamic range and average offset from zeros. The dynamic range can be identified by the difference between maximum and minimum exponent for floating point data. If input data U are 16 or 32 or 64 bits integers, then Ubits=16 or 32 or 64 respectively. If input data U are 32 bits or 64 bits floating point values, then Nexp=8 or 11 respectively. The function Fdan could be calculated by $$F_{dan} = \begin{cases} Ubits/B + \lceil og2(R) \rceil & U \text{ is integers} \\ Ubits/B + F_{var}(U/2^{V_{min}}) & U \text{ is floating point values} \end{cases}$$

where $F_{var}$ can be defined using a variation confined model, shown in FIG. 13.

In the first step 1202 of the process of FIG. 12, the encoder 316 can receive an input block of data U, and at decision step 1204 determine if U is an integer. If no, then at step 1206 the encoder 316 can define Vmin=min(exp(U)), Vmax=max (exp(U)), R=Vmax-Vmin and Rbits=ceil(log 2(R)). Next, at decision step 1216 can determine if Rbit>Nexp-3. If yes, then at step 1212 Dyna_flag=0. If no, then the at step 1214 Dyna_flag=1 and Nbits=Fdan(Q=U). At decision step 1204, if U is an integer, then at step 1208 the encoder 316 defines V=IUI, Vmin=min(V), V=max(V), and Rbits=ceil(log 2(R)). Next, at decision step 1210 the encoder 316 can determine if Rbits>Ubits-3. If yes, then at step 1212 Dyna_flag=0 and if no, then at step 1214 Dyna_flag=1 and Nbits=Fdan(Q=U).

FIG. 13 illustrates a flowchart for an exemplary method of variation confined modeling as performed on the multichannel IoT data compression encoder of FIG. 3. A variation confined model can reduce the number of bits representation by using maximum values of a current block as bound and assume the given block data are around zeros with similar variances. It can be implemented as in FIG. 13 using the equation below:

$$F_{var}(U) = \begin{cases} \lceil \log_2(\max(U)) \rceil & U \text{ is integers} \\ \lceil \log_2(\max(U_{exp})) \rceil + N_{frac} - n_0 & U \text{ is floating point values} \end{cases}$$

Where n_0 is minimum of the number of continued zeros at least digits of mantissa of floating point values U and $N_{frac}$ is 23 or 57 for 32 bits or 64 bits floating point values respectively.

The exemplary process in FIG. 13 for variation confined modeling can begin at step 1302 where the encoder 316 can receive an input block of data U. Next at decision step 1304, the encoder 316 can determine if U is an integer. If yes, then at step 1306 the encoder 316 can define Umax=max(|U|) and Nbits=ceil(log 2(Umax)). If no, then at step 1308 the encoder 316 can define Uexp=exponent (U) and Ufrac=fraction (U). At the next step 1310 the encoder 316 can define n0=min{@of 0s at Ufrac's lowest bits} and Nf=Nfract−N0. At the next step 1312, the encoder 316 can define Ne=ceil(log 2(max(Uexp))) and Nbits=Nf+Ne.

Figure 14:
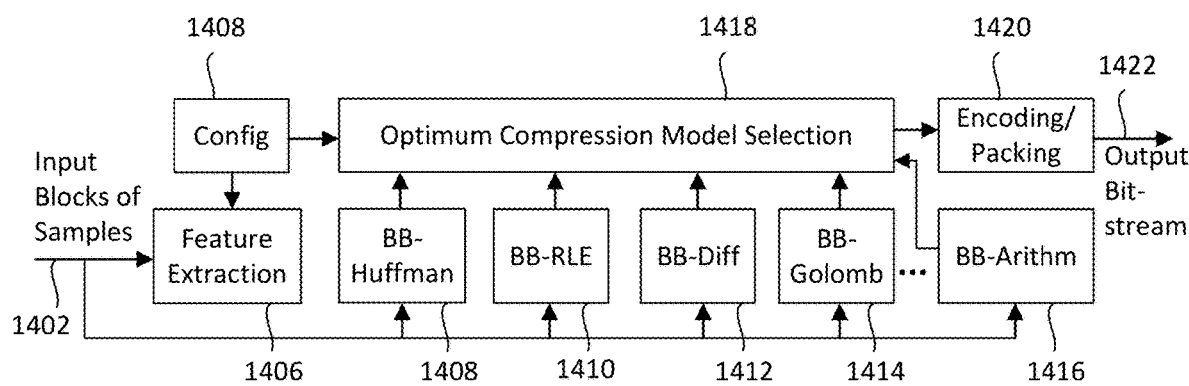
FIG. 14 illustrates a functional flowchart of an exemplary framework of a real-time adaptive entropy coding method as performed on the multichannel IoT data compression encoder of FIG. 3.

FIG. 14 illustrates a functional flowchart of a data compression framework of the embodiments as performed by the encoder 316. The BB adaptive Huffman Coding is a method implemented among the embodiments for block-based entropy coding algorithms. In the embodiments, a Huffman codebook can be sent along with the first block, then to update the codebook using Huffman codebook smoothing algorithm during the compression process. To overcome the latency inherent in contemporary file-based lossless algorithms, aspects of embodiments for telemetry data compression technology can be applied to heterogeneous logging data. The embodiments can include block-based compression methods that can perform real-time processing as a data compression framework for Adaptive BB-Entropy Encoding step 610.

In an embodiment, FIG. 14 shows input sample blocks of data 1402 can be transmitted for one or more of feature extraction 1406, block-based adaptive Huffman (BB-Huffman) coding 1408, block-based run length encoding (BB-RLE) 1410, block-based differential coding (BB-Diff) algorithms 1412, and block-based Golomb algorithms 1414. Other exemplary encoding algorithms 1416 known or future-developed can be added into the method thereby creating an efficient method to add encoding algorithms that may be changed, customized, or developed as new technology. An exemplary embodiment for an optimum compression model selection algorithm 1418 can select the most efficient encoding method among all available coding methods 1406-1416 and no coding of the data in terms of the highest possible compression ratio. The framework in FIG. 14 can be configured by configuration module 1408. After an encoding method is selected by optimum compression model selection algorithm 1418, the blocks of samples can be encoded by the selected encoding algorithm or packed at 1420. Compressed data can then be output by encoding algorithm 1420 as output bit-stream 1422.

Among all the entropy coding methods in the current embodiments, Huffman coding is theoretically the optimum statistical coding; i.e. it can represent the information using the minimum number bits, very close to its entropy, which defines the compression ratio upper bound (number of bits per sample/entropy). However, since Huffman coding assumes knowing the symbol frequencies calculated from entire dataset, it may not be optimally used for real-time processes.

The proposed BB-Huffman coding realizes real-time compression by using frequencies in the current block, adapting its dictionary among the blocks without transmitting it every block. The block sizes have direct impacts on delay, memory requirement, and computation power consumption in the real-time process. In general, reducing the block sizes will lower the compression ratios and algorithm delay.

Figure 15:
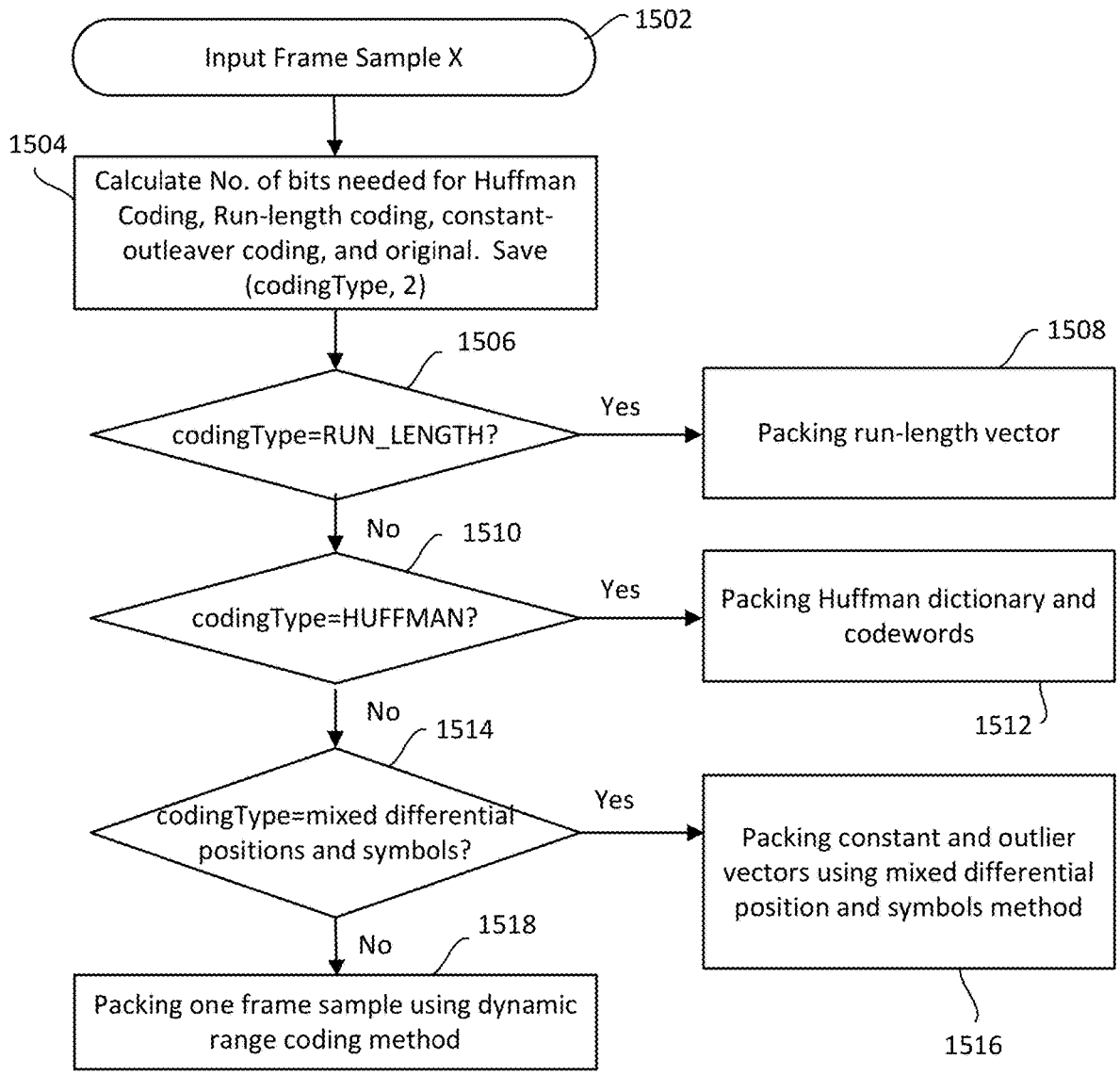
FIG. 15 illustrates a flowchart for an exemplary optimum compression model selection method as performed on the multichannel IoT data compression encoder of FIG. 3.

FIG. 15 illustrates a flowchart for an exemplary method of optimum coding selection as performed by the encoder 316. An exemplary optimum coding selection algorithm, shown in FIG. 15, can be any residual signal in compression algorithms in FIG. 14. The exemplary optimum coding selection algorithm initially may receive extracted statistical features such as probability of a value or a sequence of values or patterns to build a statistical model, which can then be used to generate codes for a value or pattern based on their probability of occurring, i.e. producing shorter codes for frequently occurring values. The embodiments for an exemplary optimum coding selection algorithm can allow determination of an optimum method of data compression without compressing the data through each coding method, which can make a real-time optimum coding selection possible.

An exemplary optimum coding selection algorithm in FIG. 15 can initiate with an input of frame sample X at step 1502, and at step 1504 can calculate the number of bits needed for Huffman coding, run-length coding, constant outleaver coding, and original coding. The calculation can be saved as (codingType, 2). At decision step 1506, the optimum coding selection algorithm can determine if the coding type equals run length (codingType=RUN_LENGTH?). If Yes, then at step 1508 the optimum coding selection algorithm can pack a run-length vector. If No, then the process continues to decision step 1510 the optimum coding selection algorithm can determine if the coding type equals Huffman coding (codingType=HUFFMAN?). If Yes, then the optimum coding selection algorithm can pack Huffman dictionary and codewords at step 1512. If No, the process continues to decision step 1514 to determine if the coding type equals mixed differential positions and symbols (codingType=mixed differential positions and symbols). If Yes, the optimum coding selection algorithm can pack constant and outlier vectors using exemplary mixed differential position and signals methods at step 1516. If No, at step 1518 the optimum coding selection algorithm can pack at least one frame sample using an exemplary dynamic range coding method.

Figure 16:
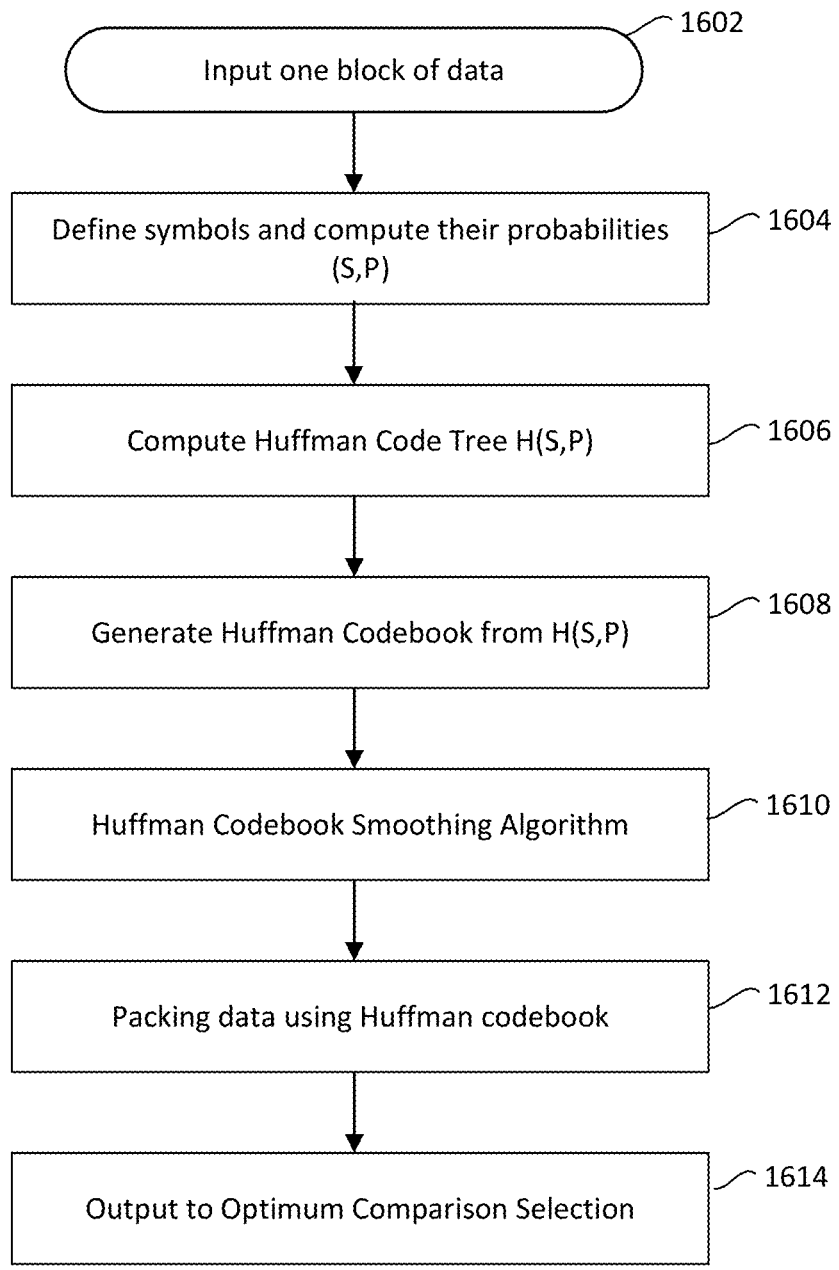
FIG. 16 illustrates a flowchart for an exemplary method of adaptive BB-Huffman encoding as performed on the multichannel IoT data compression encoder of FIG. 3.

FIG. 16 illustrates a flowchart for an exemplary method of BB-adaptive Huffman coding as performed by the encoder 316. The adaptive BB-Huffman algorithm 1408 can generate Huffman codes and adjust codebooks for a given frame or block of data while a Huffman codebook smoothing algorithm illustrated in FIG. 16 can modify transmitted codebooks to minimize the required transmission size for Huffman codebooks. In one embodiment, at step 1602 a block of data can be input into the adaptive BB-Huffman algorithm 1408 from input blocks of samples 1602. At step 1604, the adaptive BB-Huffman algorithm 1408 can define symbols and computes symbol probabilities (S,P). At step 1606, the adaptive BB-Huffman algorithm 1408 can compute a Huffman code tree H(S,P). At step 1608, the adaptive BB-Huffman algorithm 1408 can generate a Huffman codebook from the generated Huffman code tree in step 1606. At step 1610, the adaptive BB-Huffman algorithm can execute a Huffman codebook smoothing algorithm that can decide how to modify transmitted Huffman codebooks to minimize the required transmission size for the codebooks. At step 1612, the adaptive BB-Huffman algorithm 1408 can pack data along with a Huffman codebook and transmit the Huffman codebook for a given frame of data. At decision step 1614, output of the packed Huffman codebook and data can be transmitted to optimum compression model selection 1418 or returned as an input of block of data at step 1602 if a threshold optimum compression selection is not met.

Figure 17:
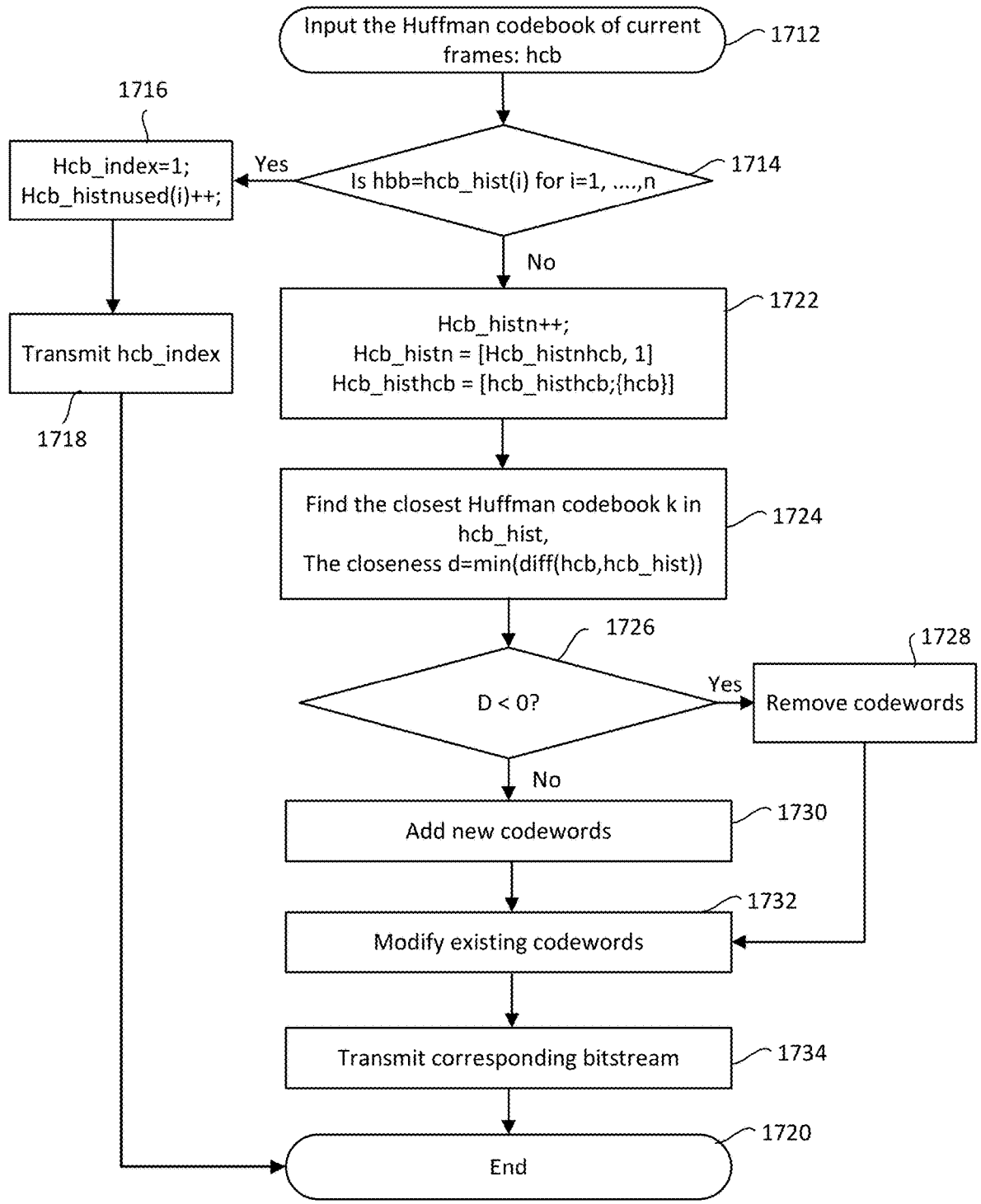
FIG. 17 illustrates a flowchart for an exemplary method of BB-Huffman tree smoothing as performed by the multichannel IoT data compression encoder of FIG. 3.

FIG. 17 illustrates a flowchart for an exemplary method of BB-Huffman tree smoothing algorithm as performed by the encoder 316. In the embodiment, at step 1712 the BB-Huffman tree smoothing algorithm may input the Huffman codebook of current frames hcb. At decision block 1714 the BB-Huffman tree smoothing algorithm may determine whether hbb=hbb_hcb_hist(i) for i=1, . . . , n. If Yes, then the algorithm can proceed to step 1716 that may calculate Hcb_index=1; Hcb_hist.nused(i)++; and at step 1718 may transmit the hcb index as Transmit hcb_index, which can end the process at step 1720. If No at step 1714, then the algorithm can proceed to step 1722, where the BB-Huffman tree smoothing algorithm may determine Hcb_hist.n++; Hcb_hist.n=[Hcb_hist.nhcb,1] and Hcb_hist.chb= [hcb_hist.hcb;{hcb}]. The process then may proceed to step 1724, where the BB-Huffman tree smoothing algorithm may find a closest Huffman codebook k in hcb_hist, where the closeness d=min(diff(hcb,hcb_hist)). At decision step 1726, the BB-Huffman tree smoothing algorithm can determine if D<0. If Yes, then at step 1728 the BB-Huffman tree smoothing algorithm may remove codewords and continue to modify existing codewords at step 1732. If No at step 1726, then the BB-Huffman tree smoothing algorithm may add new codewords at step 1730 and continue to modify existing codewords at step 1732. After modifying codeworks, the BB-Huffman tree smoothing algorithm may transmit information for an updated Huffman codebook to a corresponding bitstream at step 1734 which can then update the Huffman codebook created and transmitted with the process of FIG. 17. The process can end at block 1720.

Figure 18:
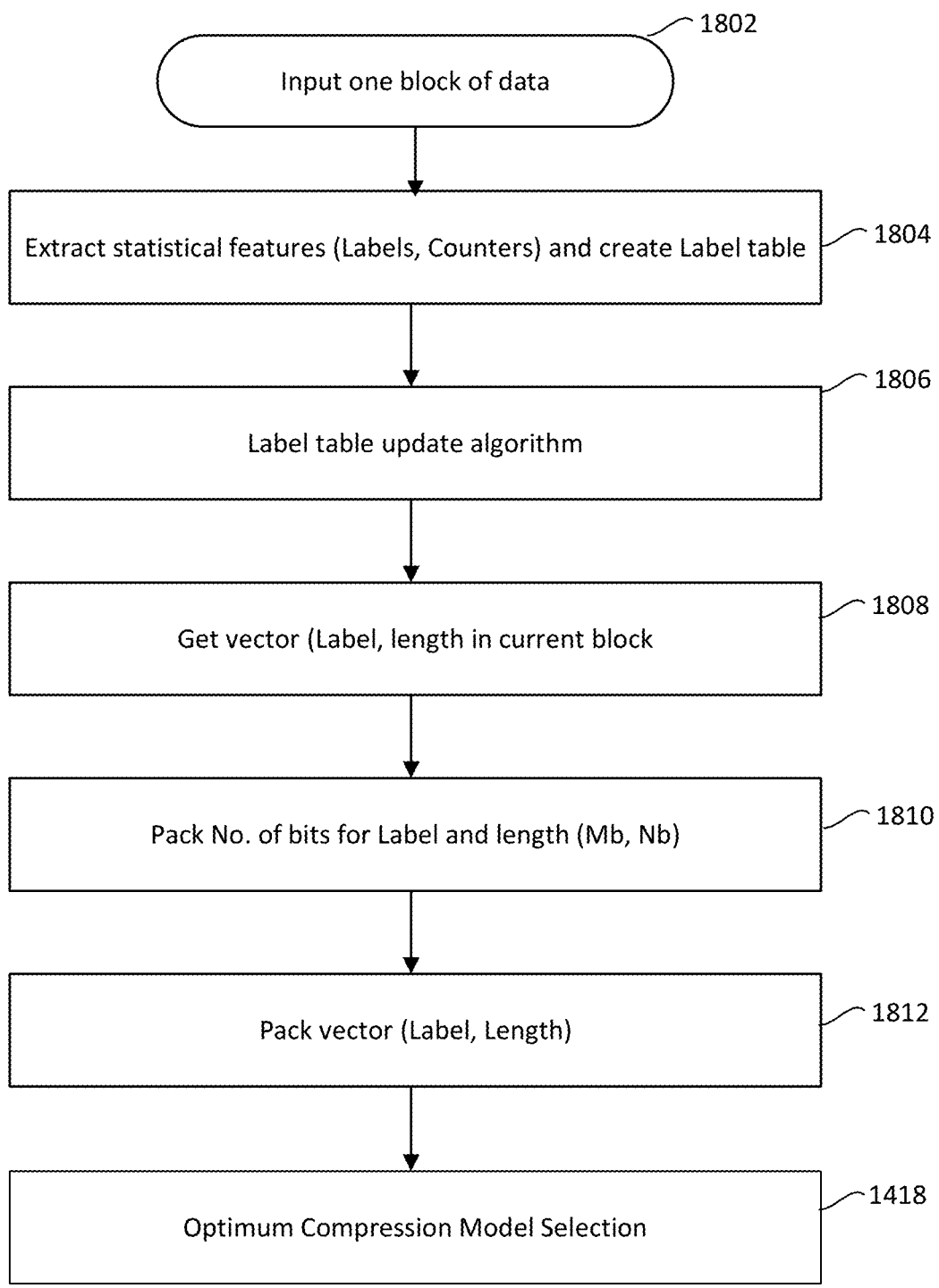
FIG. 18 illustrates a flowchart for BB-run-length encoding as performed on the multichannel IoT data compression encoder of FIG. 3.
Figure 19:
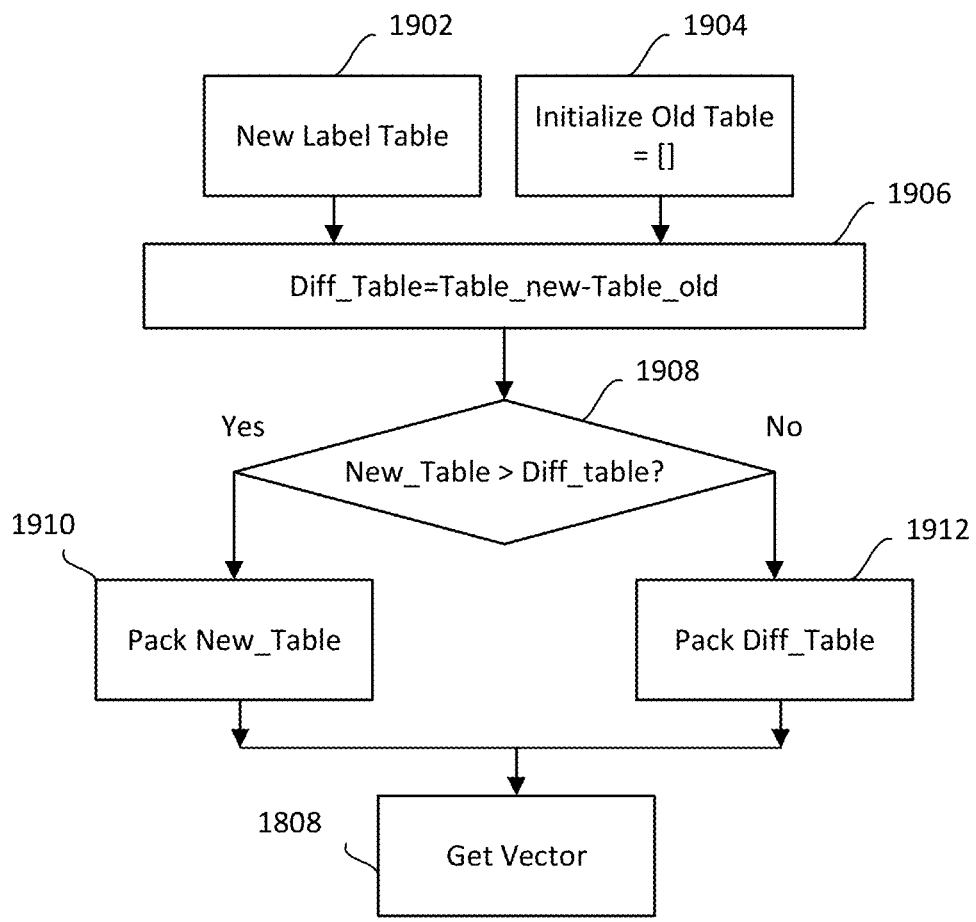
FIG. 19 illustrates a flowchart for a method of label table updating as performed on the multichannel IoT data compression encoder of FIG. 3.

FIG. 18 and FIG. 19 describe additional details of embodiments for a real-time run-length coding algorithm. FIG. 18 illustrates a method for an exemplary method of BB-run-length coding 1410 as performed by encoder 316. Another embodiment of a block-based entropy coding method is a BB-Run-length coding, in which runs of data, i.e. sequences in which the same data value occurs in many consecutive data elements, can be stored as a single data value and count, rather than as the original run. In an embodiment, BB-run-length coding can a minimum number of bits to represent a data value and count by utilizing a label table as the block size, which can be much smaller than the file size, and an actual number of labels can be smaller than the entire label set. Therefore, fewer bits can be used to represent labels. Only the label table is transmitted with the first block of data and then the label table can be updated continuously during compression processes. A difference between a current and previous label tables will indicate how to update the label table by adding to or removing labels from a previous table.

In FIG. 18, process steps for an exemplary real-time run-length coding algorithm 1410. At step 1802, the encode can receive an input of a block of data 1802, and in step 1804 the encoder 316 can extract statistical features from the block of data such as, but not limited to, labels, counters, etc. and use the extracted statistical features to create a label table. At step 1806, a first run of the label table update algorithm does not update a label table update algorithm, but a second and subsequent runs can update the label table generated in step 1804. At step 1808, the real-time run-length coding algorithm can get a vector (Label, length) in a current block of data. Next, at step 1810 the real-time run-length coding algorithm can pack a number of bits for the Label and length vector (Mb, Nb). Next, at step 1812 the real-time run-length coding algorithm can pack the vector (Label, Length) for the current block and send, at step 1418, for optimum compression model selection by the block-based encoding algorithm.

FIG. 19 illustrates a method for an exemplary label table update algorithm as performed by the encoder 316. At step 1902, the label table update algorithm can receive a new label table generated from the process in FIG. 18. At step 1904, the label table update algorithm 1906 can initialize an old label table using Initialize Old Table=[ ], and at step 1906 can create a differential table by subtracting the old label table 1904 from the new Label Table 1902 using Diff_Table=Table_new−Table_old. At decision step 1908, the label table update algorithm can determine whether the new label table is greater than the differential table using New_Table>Diff_table? If Yes, then at step 1910 the label table update algorithm can pack the new table using Pack_n_ew Table. If No, then at step 1912, the label table update algorithm can pack the differential table. In either case, label table update algorithm processes the current block to Get vector step 1808 after packing either the new table or differential table and returns prepares to receive another block 1902.

Figure 20:
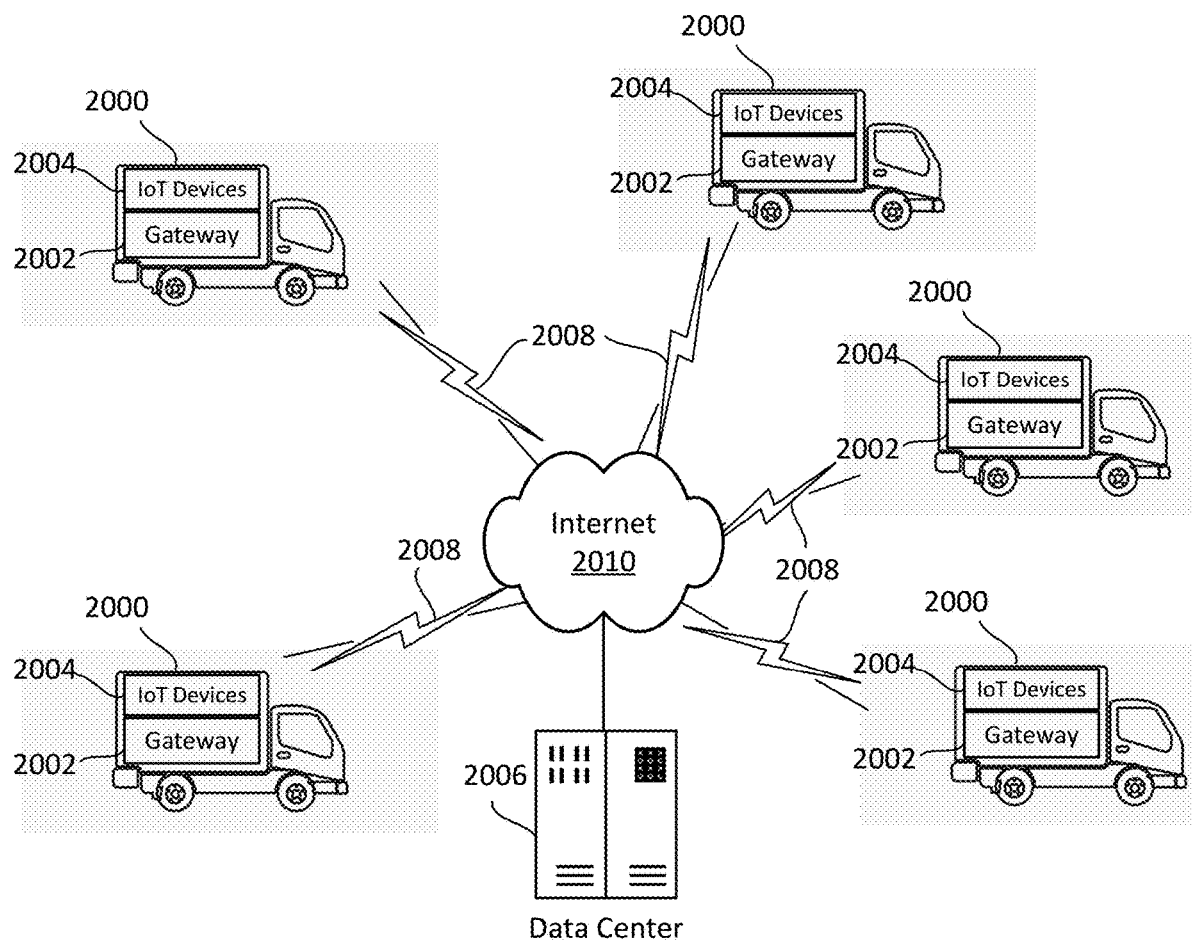
FIG. 20 illustrates a network diagram of an embodiment for an IoT ecosystem.

FIG. 20 illustrates a network diagram of an alternative embodiment for an IoT ecosystem. The IoT ecosystem includes remote IoT devices 2004 that can be installed in vehicles 2000 in a transportation network. Each vehicle 2000 can include one or more IoT device gateways 2002 or embedded systems that can receive data or images from one or more IoT devices 2004 such as but not limited to various sensors, gauges, controls, cameras, processors, etc. Each gateway 2002 can communicate over wireless network communication channels 2008 to the Internet 2010, and eventually to a data center 2006. Communication lines 108 can include communications channels in a cellular network, Wi-Fi network, Bluetooth channels, etc. In an embodiment, the network connections 2008 between IoT gateways 2002 and the data center 2006 can use network communication protocols such as packet-switched network protocols, Wi-Fi, cellular, etc.

FIG. 20 illustrates an embodiment of a livestock transportation IoT ecosystem used to test the data compression methods and systems of the embodiments. In the ecosystem, data for IoT devices 2004 was collected and stored at data center 2006. For the test, the vehicles 2000 used traditional gateway devices to collect and communicate data. In a future implementation, IoT device gateways 2002 of the embodiments will be installed in the transportation vehicles 2000. The connections between the ecosystem IoT gateways and the data center 2006 can use cellular communication channels, packet-switched network communication protocols, and local area network protocols. The data transmission between the gateways and IoT devices 2004 used packet networks in ascii data formats through Wi-Fi, Bluetooth, etc. The data compression and analytic feature detections of the embodiments can be executed at the area of data integration and gateway 2002 as described in relation to FIG. 2. As the livestock transportation company only provided logging files received at the data center 2006 for this test, the implementation of the embodiments used a file-based process. However, the software architecture of the embodiments is designed for both real-time data streaming and file-based operations.

For the test, the transportation company provided one-week data-logs from their current livestock transportation system. The dataset included 5 trips on May 11, 12, 14, 15, 16 and 17, 2018. Each trip had 15 files which contain a total of 50 sensor data streams and 15 timestamp streams. The sampling durations varied from 1 seconds to 15 minutes and their details are shown in Table 1. The types of sensors include temperature, air pressure, vehicle conditions, etc.

TABLE 1

Sensors and Sampling Rates in IoT Files

| No. | File name | Sampling duration (seconds) | # of sensors |
|---|---|---|---|
| 1 | A10M__AMPS 10 MIN | 10 | 3 |
| 2 | Gen A Amps__Gen AMPS | 10 | 3 |
| 3 | Gen A RPM Freq__Gen A Freq | 1 | 1 |
| 4 | Gen A RPM Freq__Gen A RPM | 1 | 1 |
| 5 | Gen A Volts__Gen A Volts | 10 | 4 |
| 6 | Gen B Amps__Gen B AMPS | 10 | 3 |
| 7 | Gen B RPM Freq__Gen B Freq | 1 | 1 |
| 8 | Gen B RPM Freq__Gen B RPM | 1 | 1 |
| 9 | Gen B Volts__Gen B Volts | 10 | 4 |
| 10 | Gen Water Oil__GEN Water Oil | 60 | 4 |
| 11 | P10M__PRESS 10 MIN | 10 | 4 |
| 12 | T10M__Celsius | 10 | 7 |
| 13 | T10M__TEMP 10 MIN | 10 | 8 |
| 14 | Trip Report__Trip Temp Trend C. | 900 | 3 |
| 15 | Trip Report__Trip Temp Trend F. | 900 | 3 |

In an embodiment, a real-time lossless IoT data compression algorithm was developed in MATLAB. The performance on the dataset of May 11, 2018 is shown in Table 2. The results show that the compression methods and systems of the embodiments provided significant compression ratios over a ratios using traditional ZIP compression method.

TABLE 2

IoT Data Compression of Livestock Transportation System

| | Compression Ratio | | Not identical files | | Not identical values | |
|---|---|---|---|---|---|---|
| Dataset | ZIPCR | Ours | # | total | #/total | Max(Diff) |
| May 11, 2018 | 20:65 | 42.38:1 | 1 | 13 | 24/8380 | 2.08e−17 |
| May 12, 2018 | 20.49 | 35.95 | | | | |

Our proprietary technology is based on the following ideas:

In some embodiments, advantages of the methods and systems include, but are not limited to, differential coding for varying compression needs, block process for realtime compression, an extremely small number set in one block data using symbols and reference methods, granularity constrains using a quantization factor, dynamic range limitation using a reduced number of bits for floating point representation, small variation among differences accounted for using separated integer and fraction parts.

In one embodiment, a method for lossless data compression can comprise receiving a data block by a processor; performing, by the processor, a sparse transform extraction on the data block; selecting, by the processor, a transform matrix for the data block; modeling, by the processor, the selected transform matrix for the data block; selecting, by the processor, a transform coefficient model for the data block; modeling, by the processor, the selected transform coefficient model for the data block; and compressing, by the processor, the data in the data block using the selected transform matrix and the selected transform coefficient model. In an embodiment, performing the sparse transform extraction is performed by finding non-zero components of a sparse transform matrix C from Y=CX, where X is a vector of possible values of a data type in the data block and Y is a vector of the data block. In an embodiment, selecting a transform matrix comprises selecting a direct transform model for the data block. In an embodiment, selecting a direct transform model comprises determining a size of the data block, defining a first threshold size percentage that can be applied to the data block, calculating the threshold size of the data block, determining unique values in the data block, and determining that the number of unique values in the data block is greater than the first threshold size of the data block. In an embodiment, selecting a transform matrix comprises selecting a dominant value first decomposed transform model. In an embodiment, selecting a dominant value first decomposed transform model comprises determining a size of the data block, defining a second threshold size percentage that can be applied to the data block, calculating the threshold size of the data block, determining unique values in the data block, and determining that the number of unique values in the data block is less than a second threshold size of the data block. In an embodiment, selecting a transform matrix comprises selecting a natural ordered decomposed transform model.

In an embodiment, selecting a natural ordered decomposed transform model comprises defining a first threshold size percentage that can be applied to the data block, calculating the threshold size of the data block, defining a second threshold size percentage that can be applied to the data block, calculating the threshold size of the data block, determining unique values in the data block, determining that the number of unique values in the data block is neither greater than the first threshold size of the data block nor less than a second threshold size of the data block; calculating linear prediction residuals for the number of unique values in the data block; and determining a power of the linear prediction residuals is less than a power of the unique values of the data block. In an embodiment, selecting a transform matrix comprises selecting an ascending ordered decomposed transform model. In an embodiment, selecting an ascending ordered decomposed transform model comprises determining the number of unique values in the data block is neither greater than a first threshold size of a size of the data block nor less than a second threshold size of a size of the data block; calculating linear prediction residuals for the number of unique values in the data block; and determining a power of the linear prediction residuals is greater than a power of the unique values of the data block. In an embodiment, selecting a transform coefficient model comprises selecting a prediction model. In an embodiment, selecting a transform coefficient model comprises selecting a granularity constrain model. In an embodiment, selecting a transform coefficient model comprises selecting a variation constrain model. In an embodiment, selecting a transform coefficient model comprises selecting a dynamic limitation model.

In another embodiment, a lossless data compression system, comprises a gateway comprising a processor that can receive a stream of data, wherein the processor is configured to compress data using a multichannel data compression encoder by receiving a data block; performing a sparse transform extraction on the data block; selecting a transform matrix for the data block; modeling the selected transform matrix for the data block; selecting a transform coefficient model for the data block; modeling the selected transform coefficient model for the data block; and compressing the data in the data block using the selected transform matrix and the selected transform coefficient model. In an embodiment, the processor performing the sparse transform extraction comprises finding non-zero components of a sparse transform matrix C from Y=CX, where X is a vector of possible values of a data type in the data block and Y is a vector of the data block. In an embodiment, the processor selecting a transform matrix comprises selecting a direct transform model for the data block. In an embodiment, the processor selecting a direct transform model comprises determining a size of the data block, defining a first threshold size percentage that can be applied to the data block, calculating the threshold size of the data block, determining unique values in the data block, and determining that the number of unique values in the data block is greater than the first threshold size of the data block. In an embodiment, the processor selecting a transform matrix comprises selecting a dominant value first decomposed transform model. In an embodiment, the processor selecting a dominant value first decomposed transform model comprises determining a size of the data block, defining a second threshold size percentage that can be applied to the data block, calculating the threshold size of the data block, determining unique values in the data block, and determining that the number of unique values in the data block is less than a second threshold size of the data block. In an embodiment, the processor selecting a transform matrix comprises selecting a natural ordered decomposed transform model.

In an embodiment, the processor selecting a natural ordered decomposed transform model comprises defining a first threshold size percentage that can be applied to the data block, calculating the threshold size of the data block, defining a second threshold size percentage that can be applied to the data block, calculating the threshold size of the data block, determining unique values in the data block, determining that the number of unique values in the data block is neither greater than the first threshold size of the data block nor less than a second threshold size of the data block; calculating linear prediction residuals for the number of unique values in the data block; and determining a power of the linear prediction residuals is less than a power of the unique values of the data block. In an embodiment, the processor selecting a transform matrix comprises selecting an ascending ordered decomposed transform model. In an embodiment, the processor selecting an ascending ordered decomposed transform model comprises determining the number of unique values in the data block is neither greater than a first threshold size of a size of the data block nor less than a second threshold size of a size of the data block; calculating linear prediction residuals for the number of unique values in the data block; and determining a power of the linear prediction residuals is greater than a power of the unique values of the data block. In an embodiment, the processor selecting a transform coefficient model comprises selecting a prediction model. In an embodiment, the processor selecting a transform coefficient model comprises selecting a granularity constrain model. In an embodiment, the processor selecting a transform coefficient model comprises selecting a variation constrain model. In an embodiment, the processor selecting a transform coefficient model comprises selecting a dynamic limitation model.

It will be apparent to those skilled in the art that various modifications and variations can be made to the disclosed IoT data compression system and method. Other embodiments will be apparent to those skilled in the art from consideration of the specification and practice of the disclosure. It should be appreciated that different embodiments and different features of embodiments can be used with other embodiments. It is intended that the specification and examples be considered as exemplary only, with a true scope being indicated by the following claims and their equivalents.

What is claimed is:

1. A method for lossless data compression, comprising:
receiving a data block of one-dimensional data from sensor devices or gauges by a processor;
performing, by the processor, a sparse transform of extraction on the data block, wherein the sparse transform is defined as Y=AX, wherein A is defined as an nxM sparse transfer matrix, n is a number of elements in a subset, and M is the number of elements in an original set;
selecting, by the processor, a transform matrix for the data block;
modeling, by the processor, the selected transform matrix for the data block;
selecting, by the processor, a transform coefficient model for the data block;
modeling, by the processor, the selected transform coefficient model for the data block; and
compressing, by the processor, the data in the data block using the selected transform matrix and the selected transform coefficient model.

2. The method of claim 1, wherein performing the sparse transform extraction is performed by finding non-zero components of a sparse transform matrix C from Y=CX, where X is a vector of possible values of a data type in the data block and Y is a vector of the data block.

3. The method of claim 1, wherein selecting a transform matrix comprises selecting a direct transform model for the data block.

4. The method of claim 3, wherein selecting a direct transform model comprises:
determining a size of the data block,
defining a first threshold size percentage that can be applied to the data block,
calculating the threshold size of the data block,
determining unique values in the data block, and
determining that the number of unique values in the data block is greater than the first threshold size of the data block.

5. The method of claim 1, wherein selecting a transform matrix comprises selecting a dominant value first decomposed transform model.

6. The method of claim 5, wherein selecting a dominant value first decomposed transform model comprises:
determining a size of the data block,
defining a second threshold size percentage that can be applied to the data block,
calculating the threshold size of the data block,
determining unique values in the data block, and
determining that the number of unique values in the data block is less than a second threshold size of the data block.

7. The method of claim 1, wherein selecting a transform matrix comprises selecting a natural ordered decomposed transform model.

8. The method of claim 7, wherein selecting a natural ordered decomposed transform model comprises:
defining a first threshold size percentage that can be applied to the data block,
calculating the threshold size of the data block,
defining a second threshold size percentage that can be applied to the data block,
calculating the threshold size of the data block,
determining unique values in the data block, determining that the number of unique values in the data block is neither greater than the first threshold size of the data block nor less than a second threshold size of the data block;

calculating linear prediction residuals for the number of unique values in the data block; and determining a power of the linear prediction residuals is less than a power of the unique values of the data block.

9. The method of claim 1, wherein selecting a transform matrix comprises selecting an ascending ordered decomposed transform model.

10. The method of claim 9, wherein selecting an ascending ordered decomposed transform model comprises determining the number of unique values in the data block is neither greater than a first threshold size of a size of the data block nor less than a second threshold size of a size of the data block;

calculating linear prediction residuals for the number of unique values in the data block; and determining a power of the linear prediction residuals is greater than a power of the unique values of the data block.

11. The method of claim 1, wherein selecting a transform coefficient model comprises selecting a prediction model.

12. The method of claim 1, wherein selecting a transform coefficient model comprises selecting a granularity constrain model.

13. The method of claim 1, wherein selecting a transform coefficient model comprises selecting a variation constrain model.

14. The method of claim 1, wherein selecting a transform coefficient model comprises selecting a dynamic limitation model.

15. A lossless data compression system, comprising:

a gateway comprising a processor that can receive a stream of one-dimensional data from sensor devices or gauges, wherein the processor is configured to compress data using a multichannel data compression encoder by:

receiving a data block;

performing a sparse transform extraction on the data block, wherein the sparse transform is defined as $Y=AX$, wherein A is defined as an nxM sparse transfer matrix, n is a number of elements in a subset, and M is the number of elements in an original set;

selecting a transform matrix for the data block;

modeling the selected transform matrix for the data block;

selecting a transform coefficient model for the data block;

modeling the selected transform coefficient model for the data block; and compressing the data in the data block using the selected transform matrix and the selected transform coefficient model.

16. The system of claim 15, wherein the processor performing the sparse transform extraction comprises finding non-zero components of a sparse transform matrix C from $Y=CX$, where X is a vector of possible values of a data type in the data block and Y is a vector of the data block.

17. The system of claim 15, wherein the processor selecting a transform matrix comprises selecting a direct transform model for the data block.

18. The system of claim 17, wherein the processor selecting a direct transform model comprises:

determining a size of the data block, defining a first threshold size percentage that can be applied to the data block, calculating the threshold size of the data block, determining unique values in the data block, and determining that the number of unique values in the data block is greater than the first threshold size of the data block.

19. The system of claim 15, wherein the processor selecting a transform matrix comprises selecting a dominant value first decomposed transform model.

20. The system of claim 19, wherein the processor selecting a dominant value first decomposed transform model comprises:

determining a size of the data block, defining a second threshold size percentage that can be applied to the data block, calculating the threshold size of the data block, determining unique values in the data block, and determining that the number of unique values in the data block is less than a second threshold size of the data block.

21. The system of claim 15, wherein the processor selecting a transform matrix comprises selecting a natural ordered decomposed transform model.

22. The system of claim 21, wherein the processor selecting a natural ordered decomposed transform model comprises:

defining a first threshold size percentage that can be applied to the data block, calculating the threshold size of the data block, defining a second threshold size percentage that can be applied to the data block, calculating the threshold size of the data block, determining unique values in the data block, determining that the number of unique values in the data block is neither greater than the first threshold size of the data block nor less than a second threshold size of the data block;

calculating linear prediction residuals for the number of unique values in the data block; and determining a power of the linear prediction residuals is less than a power of the unique values of the data block.

23. The system of claim 15, wherein the processor selecting a transform matrix comprises selecting an ascending ordered decomposed transform model.

24. The system of claim 23, wherein the processor selecting an ascending ordered decomposed transform model comprises determining the number of unique values in the data block is neither greater than a first threshold size of a size of the data block nor less than a second threshold size of a size of the data block;

calculating linear prediction residuals for the number of unique values in the data block; and determining a power of the linear prediction residuals is greater than a power of the unique values of the data block.

25. The system of claim 15, wherein the processor selecting a transform coefficient model comprises selecting a prediction model.

26. The system of claim 15, wherein the processor selecting a transform coefficient model comprises selecting a granularity constrain model.

27. The system of claim 15, wherein the processor selecting a transform coefficient model comprises selecting a variation constrain model.

28. The system of claim 15, wherein the processor selecting a transform coefficient model comprises selecting a dynamic limitation model.

* * * * *